(12) United States Patent
Baek

(10) Patent No.: US 12,328,876 B2
(45) Date of Patent: Jun. 10, 2025

(54) THREE-DIMENSIONAL SEMICONDUCTOR MEMORY DEVICE

(71) Applicant: Samsung Electronics Co., Ltd., Suwon-si (KR)

(72) Inventor: Seokcheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 955 days.

(21) Appl. No.: 17/198,838

(22) Filed: Mar. 11, 2021

(65) Prior Publication Data

US 2021/0202522 A1 Jul. 1, 2021

Related U.S. Application Data

(63) Continuation of application No. 16/570,106, filed on Sep. 13, 2019, now Pat. No. 10,978,475.

(30) Foreign Application Priority Data

Dec. 14, 2018 (KR) .................. 10-2018-0161618

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5226* (2013.01); *H01L 23/5283* (2013.01);
(Continued)

(58) Field of Classification Search
CPC ........ H10B 43/27; H10B 41/27; H10B 41/35; H10B 41/41; H10B 43/35; H10B 43/40;
(Continued)

(56) References Cited

U.S. PATENT DOCUMENTS 8,765,598 B2 * 7/2014 Smith ............... H01L 21/76816
257/773
9,136,277 B2 9/2015 Lai et al.
(Continued)

FOREIGN PATENT DOCUMENTS

CN 103582944 A 2/2014
CN 104733462 A 6/2015
(Continued)

*Primary Examiner* — Fernando L Toledo
*Assistant Examiner* — Jahae Kim
(74) *Attorney, Agent, or Firm* — Myers Bigel, P.A.

(57) ABSTRACT

A three-dimensional semiconductor memory device may include a substrate including a cell array region and a pad region, a first conductive line on the cell array region and the pad region of the substrate, a second conductive line between the first conductive line and the substrate, the second conductive line including a first portion on the cell array region and a second portion on the pad region and exposed by the first conductive line in a plan view, a first edge pattern between the substrate and the first conductive line and between the first and second portions of the second conductive line, and a first cell contact plug on the pad region of the substrate that penetrates the first conductive line and the first edge pattern.

20 Claims, 34 Drawing Sheets

(51) Int. Cl.
*H01L 23/528* (2006.01)
*H01L 23/535* (2006.01)
*H10B 41/27* (2023.01)
*H10B 41/35* (2023.01)
*H10B 41/41* (2023.01)
*H10B 43/35* (2023.01)
*H10B 43/40* (2023.01)

(52) U.S. Cl.
CPC ............ *H01L 23/535* (2013.01); *H10B 41/27* (2023.02); *H10B 41/35* (2023.02); *H10B 41/41* (2023.02); *H10B 43/35* (2023.02); *H10B 43/40* (2023.02)

(58) Field of Classification Search
CPC ........ H10B 43/50; H10B 41/50; H10B 41/20; H10B 43/20; H01L 23/5226; H01L 23/5283; H01L 23/535; H01L 23/5386; H01L 21/768
See application file for complete search history.

(56) References Cited

U.S. PATENT DOCUMENTS

| | | | |
|---|---|---|---|
| 9,331,082 | B2 | 5/2016 | Lee et al. |
| 9,520,402 | B1 | 12/2016 | Haller et al. |
| 9,640,542 | B2 | 5/2017 | Lee et al. |
| 9,768,223 | B2 | 9/2017 | Lin et al. |
| 9,853,038 | B1 | 12/2017 | Cui |
| 9,865,540 | B2 | 1/2018 | Kim et al. |
| 9,871,053 | B2 | 1/2018 | Kwak |
| 9,991,271 | B2 | 6/2018 | Kang et al. |
| 10,290,575 | B2 | 5/2019 | Smith et al. |
| 10,566,343 | B2 | 2/2020 | Oh et al. |
| 10,886,289 | B2 | 1/2021 | Kang et al. |
| 2010/0207240 | A1 | 8/2010 | Hashimoto et al. |
| 2015/0270165 | A1* | 9/2015 | Hyun .................... H10B 43/35 257/329 |
| 2016/0163732 | A1* | 6/2016 | Lim ...................... H10B 43/27 257/314 |
| 2017/0200676 | A1 | 7/2017 | Jeong et al. |
| 2018/0166462 | A1 | 6/2018 | Kim et al. |
| 2018/0197874 | A1* | 7/2018 | Oshiki .................. H10B 43/50 |
| 2019/0157282 | A1 | 5/2019 | Jung |
| 2021/0335815 | A1* | 10/2021 | Jayanti ................. H01L 29/511 |
| 2023/0292515 | A1* | 9/2023 | Son ....................... H10B 43/27 |

FOREIGN PATENT DOCUMENTS

| | | |
|---|---|---|
| KR | 20170046892 A | 5/2017 |
| KR | 20170125551 A | 11/2017 |
| KR | 1020170139390 A | 12/2017 |

* cited by examiner

THREE-DIMENSIONAL SEMICONDUCTOR MEMORY DEVICE

CROSS-REFERENCE TO RELATED APPLICATION

The current application is a continuation of U.S. patent application Ser. No. 16/570,106, filed Sep. 13, 2019, which claims priority under 35 U.S.C. § 119 to Korean Patent Application No. 10-2018-0161618, filed on Dec. 14, 2018, in the Korean Intellectual Property Office, the entire contents of which are hereby incorporated by reference.

BACKGROUND OF THE INVENTION

The present disclosure relates to semiconductor memory devices, and in particular, to three-dimensional semiconductor memory devices.

Higher integration of semiconductor memory devices may be required to satisfy consumer demands for superior performance and inexpensive prices. In the case of semiconductor memory devices, since because integration may be an important factor in determining product prices, increased integration may be especially desirable. In the case of two-dimensional or planar semiconductor memory devices, because their integration may be primarily determined by the area occupied by a unit memory cell, integration may be greatly influenced by the level of a fine pattern forming technology. However, the process equipment used to increase pattern fineness may be expensive and may set a practical limitation on increasing integration for two-dimensional or planar semiconductor devices. Three-dimensional semiconductor memory devices including three-dimensionally arranged memory cells have recently been proposed to address such a limitation.

SUMMARY

Some embodiments of the inventive concept may provide a three-dimensional semiconductor memory device with improved reliability.

According to some embodiments of the inventive concept, a three-dimensional semiconductor memory device may include a substrate including a cell array region and a pad region, a first conductive line on the cell array region and the pad region of the substrate, a second conductive line between the first conductive line and the substrate, the second conductive line including a first portion disposed on the cell array region and a second portion on the pad region and exposed by the first conductive line in a plan view, a first edge pattern between the substrate and the first conductive line and between the first and second portions of the second conductive line, and a first cell contact plug on the pad region of the substrate that penetrates the first conductive line and the first edge pattern.

According to some embodiments of the inventive concept, a three-dimensional semiconductor memory device may include a first edge pattern and a second edge pattern spaced apart from each other in a first direction, on a substrate, a first gate electrode between the first edge pattern and the second edge pattern, a second gate electrode on the first gate electrode and vertically overlapping the first edge pattern and the second edge pattern in a direction extending perpendicular to an upper surface of the substrate, and a cell contact plug penetrating the second gate electrode and the second edge pattern.

According to some embodiments of the inventive concept, a three-dimensional semiconductor memory device may include a substrate including a cell array region and a pad region, an insulating gapfill layer in the pad region of the substrate, a first gate electrode and a second gate electrode sequentially stacked on the substrate, and first and second cell contact plugs on the pad region of the substrate to be in contact with the first and second gate electrodes, respectively. At least one of the first and second cell contact plugs may include a portion in the insulating gapfill layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 12A to 17A, and 19A are sectional views, each of which is taken along a line I-I' of FIG. 2 to illustrate a three-dimensional semiconductor memory device according to some embodiments of the inventive concept.

FIGS. 12B to 17B, 18A, and 19B are sectional views, each of which is taken along a line II-II' of FIG. 2 to illustrate a three-dimensional semiconductor memory device according to some embodiments of the inventive concept.

FIGS. 12C to 17C, 18B, and 19C are sectional views, each of which is taken along a line III-III' of FIG. 2 to illustrate a three-dimensional semiconductor memory device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concept will now be described more fully with reference to the accompanying drawings, in which example embodiments of the inventive concept are shown. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1:
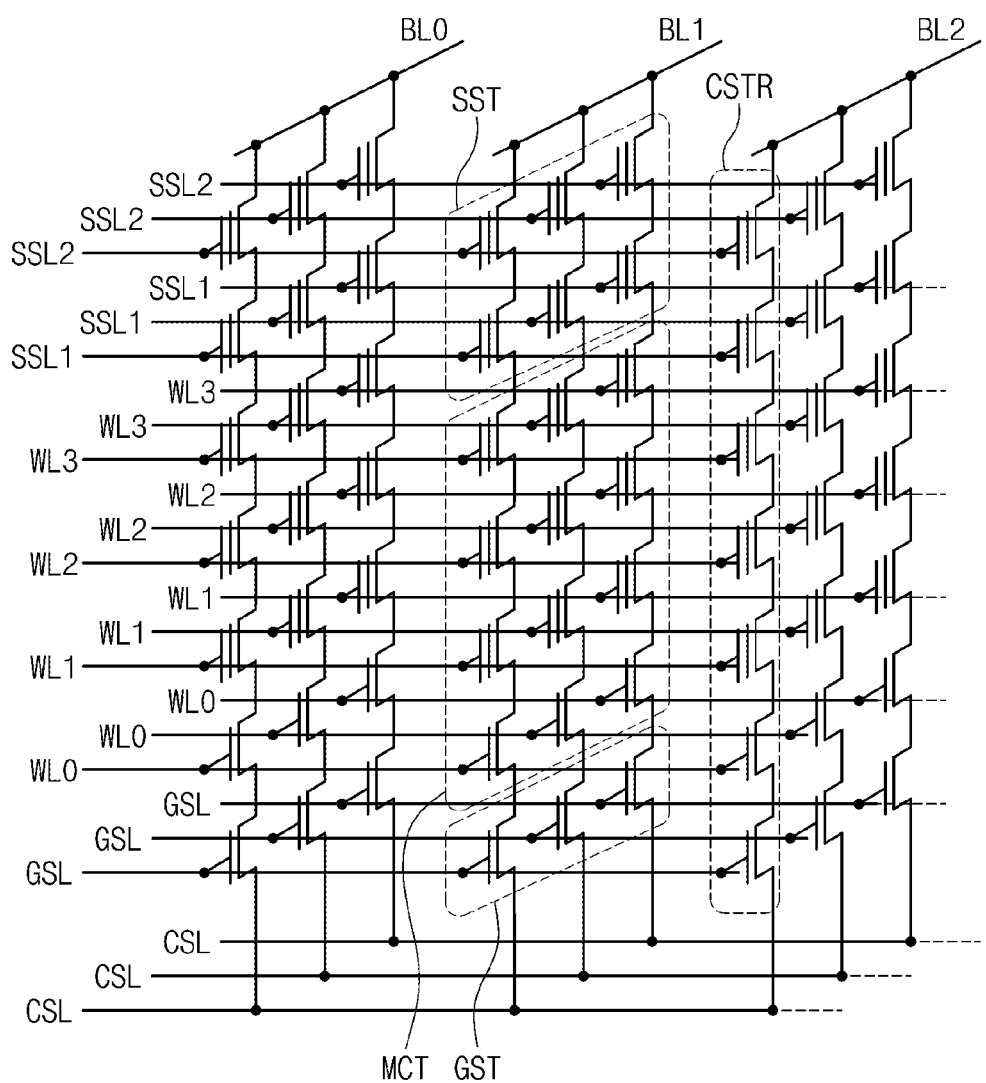
FIG. 1 is a circuit diagram schematically illustrating a cell array of a three-dimensional semiconductor memory device according to some embodiments of the inventive concept.

FIG. 1 is a circuit diagram schematically illustrating a cell array of a three-dimensional semiconductor memory device according to some embodiments of the inventive concept.

Referring to FIG. 1, a three-dimensional semiconductor memory device may include a common source line CSL, a plurality of bit lines BL0-BL2, and a plurality of cell strings CSTR disposed between the common source line CSL and the bit lines BL0-BL2.

The bit lines BL0-BL2 may be two-dimensionally arranged on a substrate, and the plurality of the cell strings CSTR may be connected in parallel to each of the bit lines BL0-BL2. Accordingly, the cell strings CSTR may be two-dimensionally arranged on the common source line CSL or the substrate.

Each of the cell strings CSTR may be configured to include a ground selection transistor GST electrically connected to the common source line CSL, a string selection transistor SST electrically connected to one of the bit lines BL0-BL2, and a plurality of memory cell transistors MCT disposed between the ground and string selection transistors GST and SST. The ground selection transistor GST, the memory cell transistors MCT, and the string selection transistor SST constituting each of the cell strings CSTR may be connected in series. Furthermore, a ground selection line GSL, a plurality of word lines WL0-WL3, and a plurality of string selection lines SSL0-SSL2 may be provided between the common source line CSL and the bit lines BL0-BL2 and may be used as respective gate electrodes of the ground selection transistor GST, the memory cell transistors MCT, and the string selection transistors SST.

Figure 2:
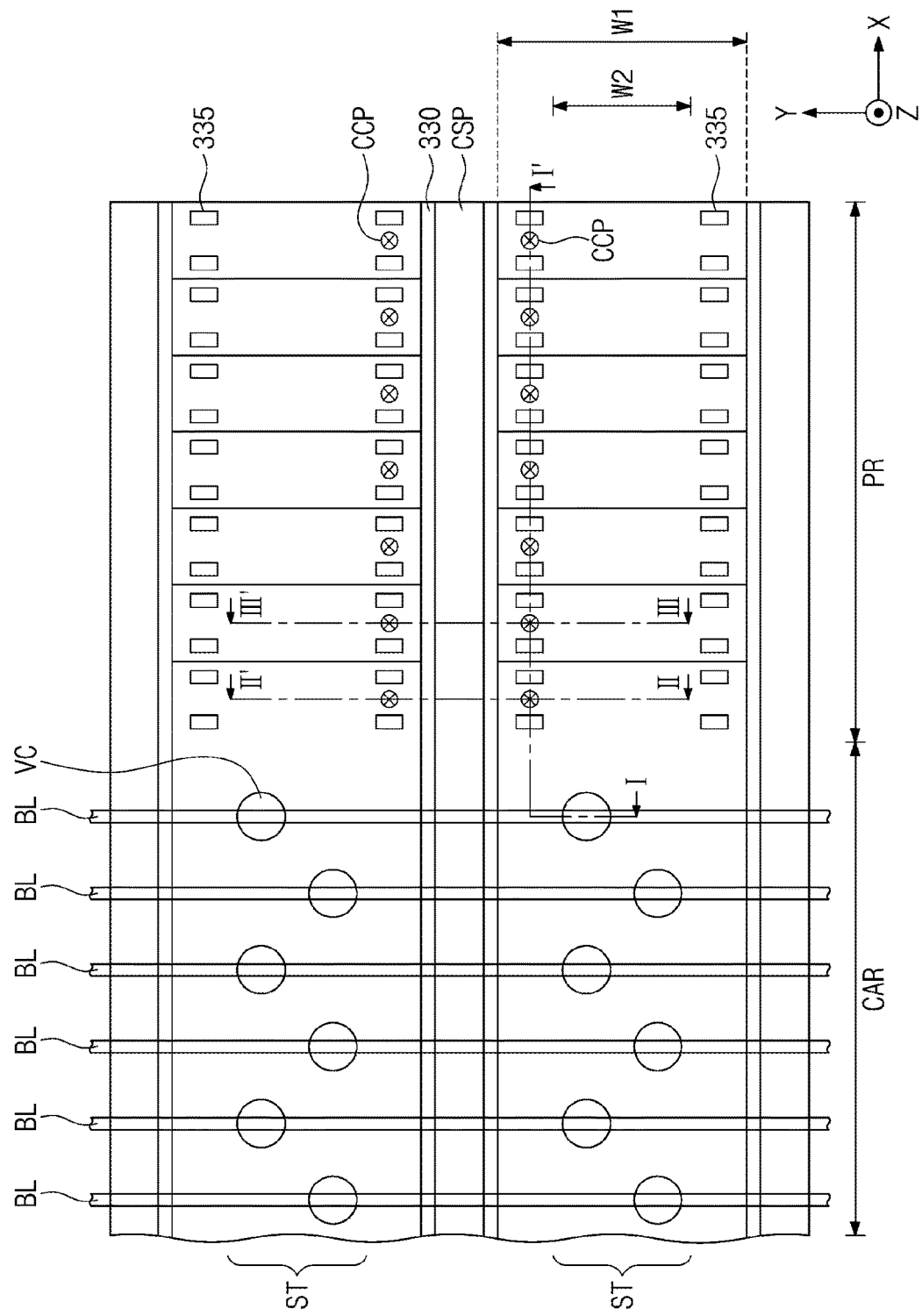
FIG. 2 is a plan view illustrating a three-dimensional semiconductor memory device according to some embodiments of the inventive concept.
Figure 3:
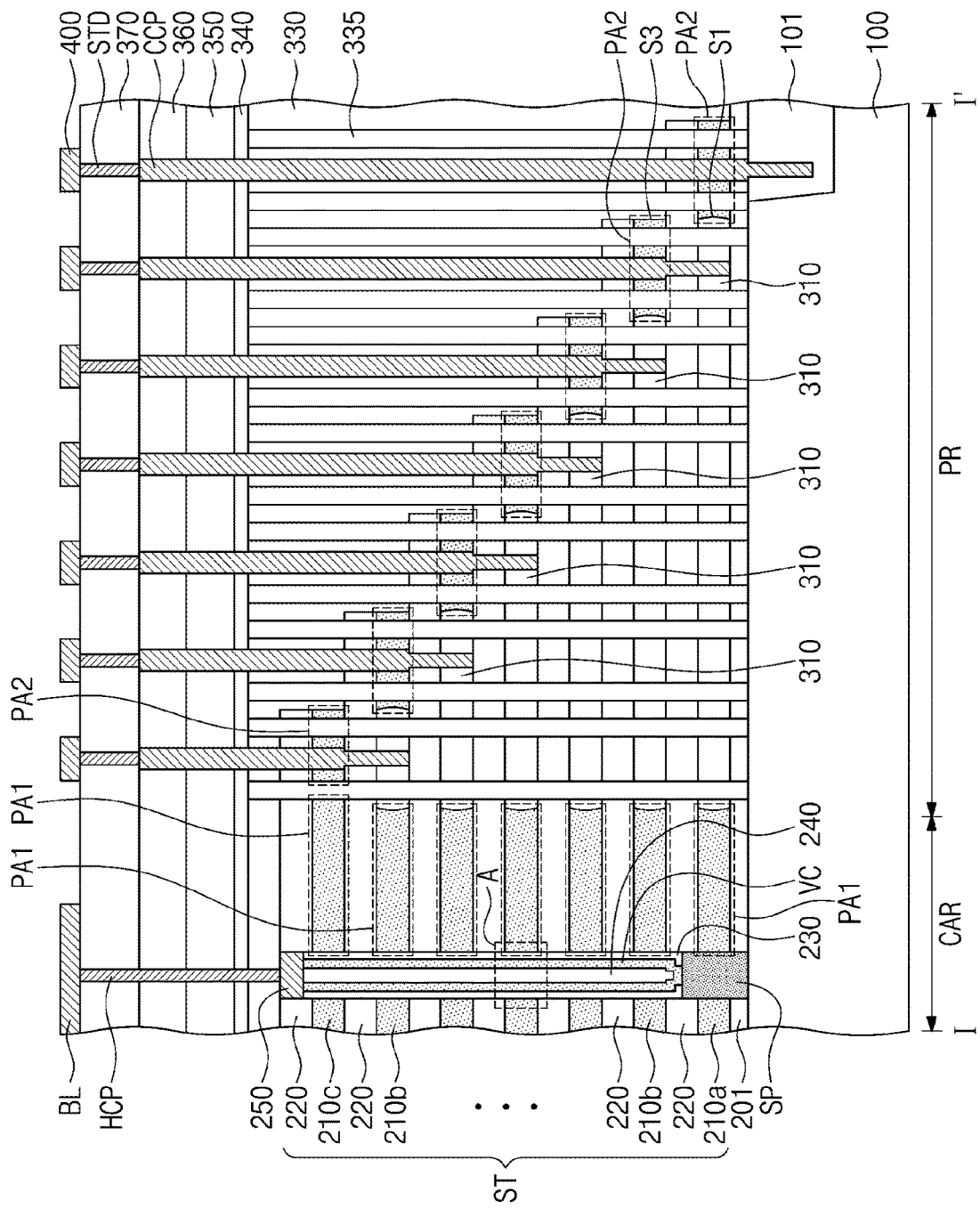
FIG. 3 is a sectional view, which is taken along a line I-I' of FIG. 2 to illustrate a three-dimensional semiconductor memory device according to some embodiments of the inventive concept.
Figure 4:
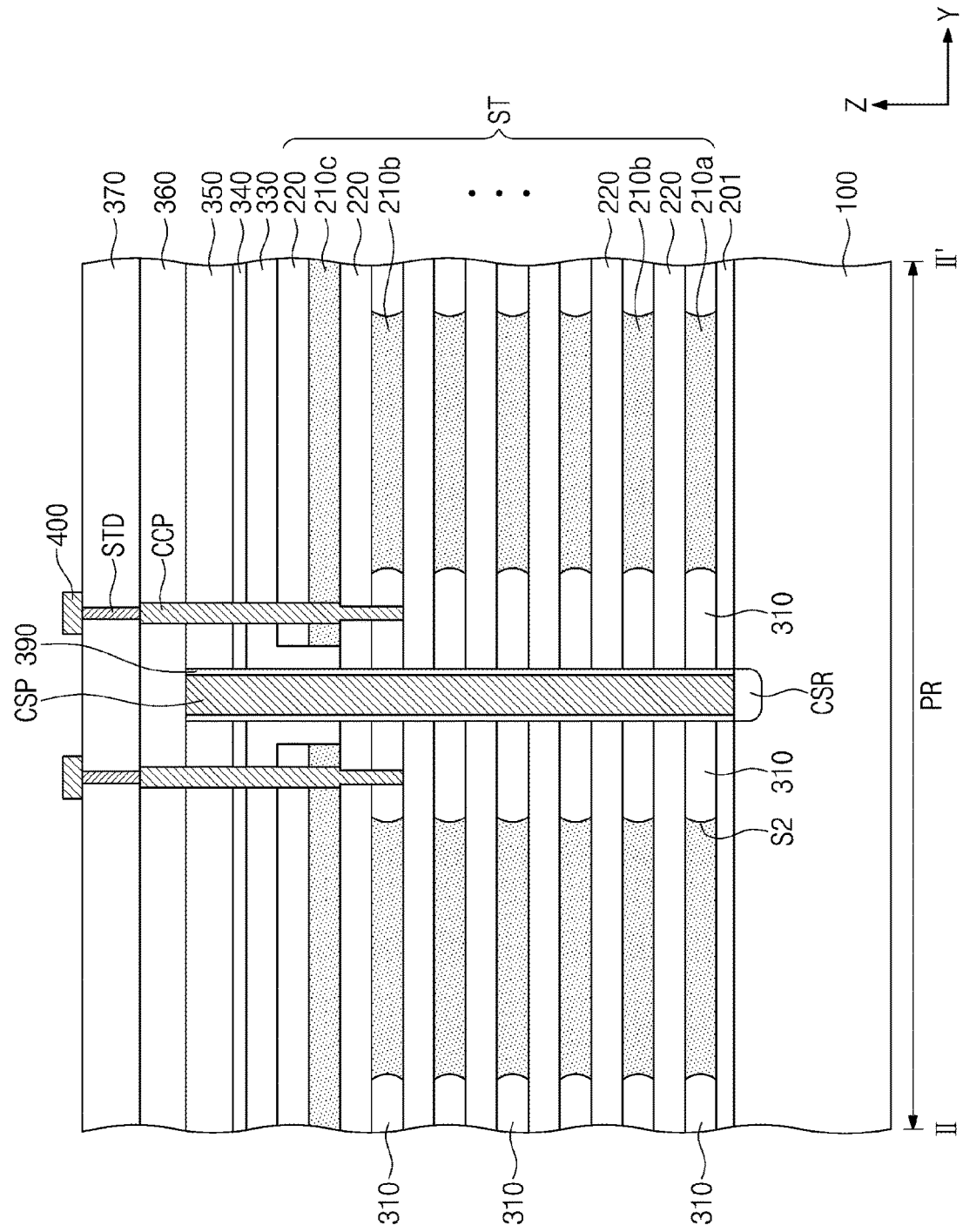
FIG. 4 is a sectional view, which is taken along a line II-II' of FIG. 2 to illustrate a three-dimensional semiconductor memory device according to some embodiments of the inventive concept.
Figure 5:
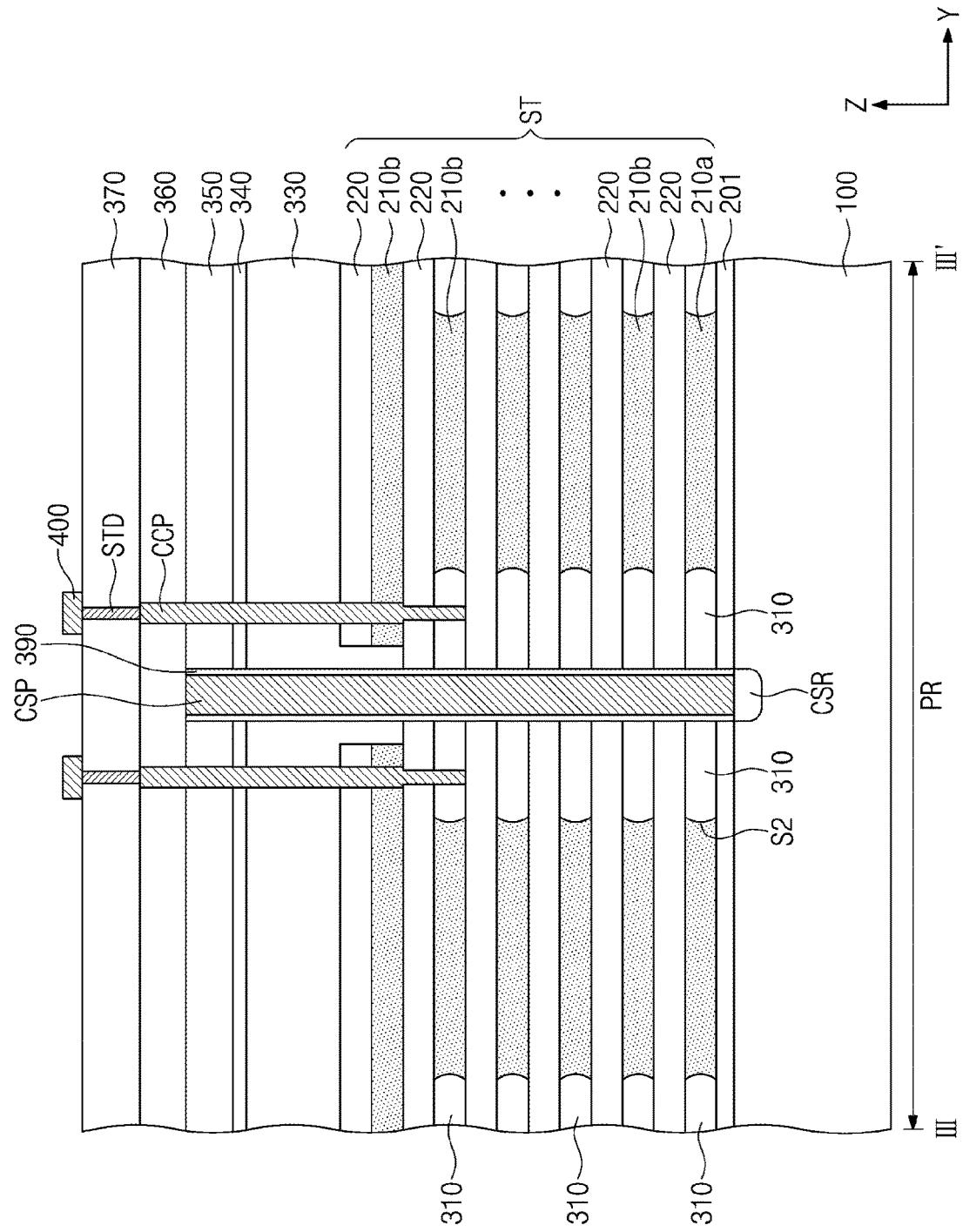
FIG. 5 is a sectional view, which is taken along a line III-III' of FIG. 2 to illustrate a three-dimensional semiconductor memory device according to some embodiments of the inventive concept.
Figure 6A:
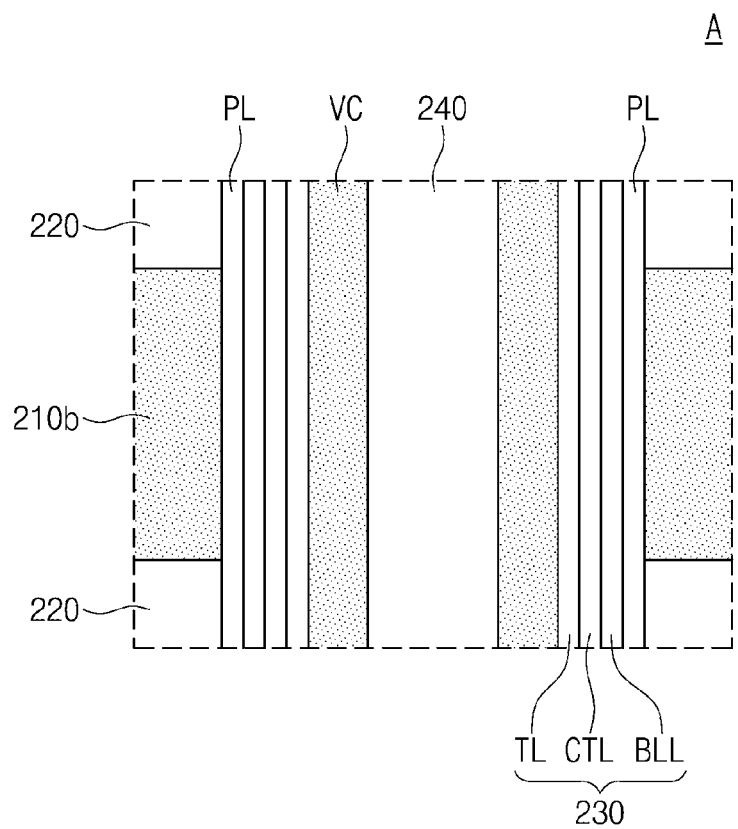
FIG. 6A is an enlarged sectional view illustrating a portion A of FIG. 3.

FIG. 2 is a plan view illustrating a three-dimensional semiconductor memory device according to some embodiments of the inventive concept. FIG. 3 is a sectional view, which is taken along a line I-I' of FIG. 2 to illustrate a three-dimensional semiconductor memory device according to some embodiments of the inventive concept. FIG. 4 is a sectional view, which is taken along a line II-II' of FIG. 2 to illustrate a three-dimensional semiconductor memory device according to some embodiments of the inventive concept. FIG. 5 is a sectional view, which is taken along a line III-III' of FIG. 2 to illustrate a three-dimensional semiconductor memory device according to some embodiments of the inventive concept. FIG. 6A is an enlarged sectional view illustrating a portion A of FIG. 3.

Referring to FIGS. 2 to 5, stacks ST may be disposed on an upper surface of a substrate 100. The substrate 100 may include a cell array region CAR and a pad region PR. The substrate 100 may be a silicon substrate, a silicon-germanium substrate, a germanium substrate, or a poly- or single-crystalline epitaxial layer grown on a single-crystalline silicon substrate. An insulating gapfill layer 101 may be disposed in the substrate 100. The insulating gapfill layer 101 may be disposed in the pad region PR of the substrate 100. The insulating gapfill layer 101 may be formed of or include at least one of, for example, silicon oxide, silicon nitride, or silicon oxynitride. The stacks ST may be spaced apart from each other in a second direction Y on the upper surface of the substrate 100. The stacks ST may extend in a first direction X crossing the second direction Y. In other words, the stacks ST may extend from the cell array region CAR of the substrate 100 to the pad region PR. A buffer insulating pattern 201 may be disposed between each of the stacks ST and the substrate 100. The buffer insulating pattern 201 may include at least one of, for example, a silicon oxide layer or a thermally-grown oxide layer.

Each of the stacks ST may include gate electrodes 210a, 210b, and 210c and insulating patterns 220. The gate electrodes 210a, 210b, and 210c and the insulating patterns 220 may be alternately and repeatedly stacked on the substrate 100 in a vertical direction (e.g., a Z direction that extends perpendicular to the upper surface of the substrate 100). The gate electrodes 210a, 210b, and 210c may include a ground selection gate electrode 210a, cell gate electrodes 210b, and a string selection gate electrode 210c. The ground selection gate electrode 210a may be the lowermost electrode of the gate electrodes 210a, 210b, and 210c, i.e., the one of the gate electrodes 210a, 210b, and 210c that is closest to the substrate. The string selection gate electrode 210c may be the uppermost electrode of the gate electrodes 210a, 210b, and 210c, i.e., the one of gate electrodes 210a, 210b, and 210c that is farthest away from the substrate. The cell gate electrodes 210b may be disposed between the ground selection gate electrode 210a and the string selection gate electrode 210c. The gate electrodes 210a, 210b, and 210c may include at least one of, for example, a semiconductor layer (e.g., a poly-silicon layer) or a metal layer (e.g., a tungsten layer). The insulating patterns 220 may be provided between the gate electrodes 210a, 210b, and 210c, which are adjacent to each other in a third direction Z, and on a string selection gate electrode 220c. The insulating patterns 220 may be formed of or include, for example, silicon oxide.

Each of the stacks ST may have a stepwise structure on the pad region PR of the substrate 100. For example, a height of the stack ST in the Z direction may decrease with increasing distance from the cell array region CAR. In detail, a length of each of the gate electrodes 210a, 210b, and 210c in the first direction X may decrease with increasing distance from the substrate 100. As a result, gate electrodes 210a, 210b, and 210c may expose other gate electrodes 210a, 210b, and 210c in a plan view that are closer to the substrate 100. Moreover, edge patterns 310 may vertically overlap, i.e., overlap in a direction extending perpendicular to the upper surface of the substrate 100, those gate electrodes 210a, 210b, and 210c that are farther away from the substrate 100 than the gate electrode 210a, 210b, and 210c with which side surfaces of the edge pattern 310 are in contact. In some embodiments, each of the gate electrodes 210a, 210b, and 210c may have an end portion, on the pad region PR of the substrate 100. The end portion may be a portion of each of the ground selection and cell gate electrodes 210a and 210b exposed by another gate electrode directly disposed thereon. The end portion of the string selection gate electrode 210c may be a portion of the string selection gate electrode 210c disposed on the pad region PR.

Figure 6B:
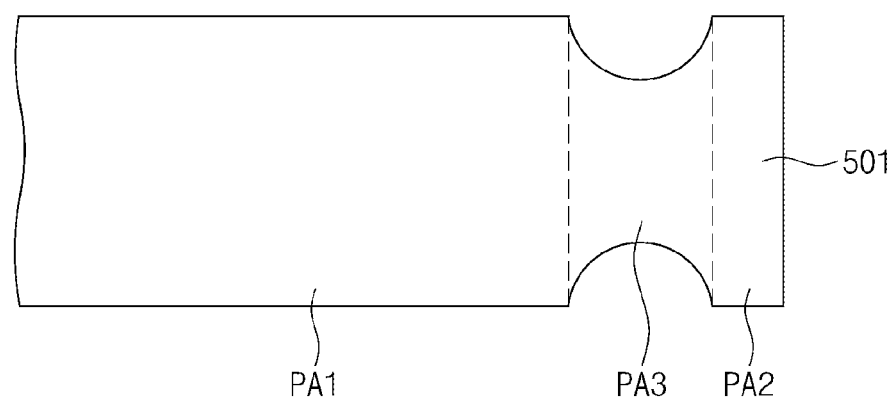
FIG. 6B is a plan view illustrating an uppermost cell gate electrode of FIG. 3.

In some embodiments, each of the ground selection and cell gate electrodes 210a and 210b may include a first portion PA1, a second portion PA2, and a third portion PA3 (e.g., see FIG. 6B). The first portion PA1 of each of the ground selection and cell gate electrodes 210a and 210b may be disposed on the cell array region CAR of the substrate 100. The second portion PA2 of each of the ground selection and cell gate electrodes 210a and 210b may be disposed on the pad region PR of the substrate 100. The third portion PA3 may be disposed between the first and second portions PA1 and PA2. The second portions PA2 of the ground selection and cell gate electrodes 210a and 210b may correspond to the end portions of the ground selection and cell gate electrodes 210a and 210b. For example, in each of the ground selection and cell gate electrodes 210a and 210b, the second portion PA2 may be a portion exposed by another gate electrode directly disposed thereon in a plan view. FIG. 6B illustrates the uppermost one of the cell gate electrodes 210b in the Z direction, and the cell gate electrodes 210b and the ground selection gate electrode 210a may have the same planar shape as that of the uppermost cell gate electrode 210b. Although the uppermost cell gate electrode 210b is representatively illustrated in FIG. 6B, lengths, in the first direction X of the third portions PA3 of the ground and cell gate electrodes 210a and 210b may decrease with increasing distance from the substrate 100. The string selection gate electrode 210c may include the first and second portions PA1 and PA2. The second portion PA2 of the string selection gate electrode 210c may correspond to the end portion of the string selection gate electrode 210c.

A length of each of the insulating patterns 220 in the first direction X may decrease with increasing distance from the substrate 100. When measured in the first direction X, the length of each of the insulating patterns 220 may be substantially the same as a length of one of the gate electrodes 210a, 210b, and 210c thereunder. Thus, the end portions (or the second portions PA2) of the ground selection and cell gate electrodes 210a and 210b may, in some embodiments, be fully covered in a Z direction with the insulating patterns 220 thereon. In other words, the insulating patterns 220 may completely overlap the ground selection and cell gate electrodes 210a and 210b in a plan view of the device.

Vertical channel portions VC may be disposed in the stack ST, which is provided on the cell array region CAR of the substrate 100 (see FIG. 2). The vertical channel portions VC may be provided on the upper surface of the substrate 100 to penetrate the stack ST. The vertical channel portions VC may be disposed to form a zigzag or linear arrangement in the first direction X. The vertical channel portions VC may have a hollow pipe shape, a cylindrical shape, or a cup shape. Each of the vertical channel portions VC may include a single layer or a plurality of layers. The vertical channel portions VC may be formed of or include at least one of, for example, single crystalline silicon, organic semiconductor materials, or carbon nanostructures.

Semiconductor pillars SP may be disposed between the vertical channel portions VC and the substrate 100. The semiconductor pillars SP may be provided on the upper surface of the substrate 100 to penetrate the ground selection gate electrode 210a (see FIG. 3). The semiconductor pillars SP and the vertical channel portions VC may be in physical contact with each other. The semiconductor pillars SP may be formed of a semiconductor material having the same conductivity type as the substrate 100 or may be formed of an intrinsic semiconductor material.

Charge storing structures 230 may be disposed between the vertical channel portions VC and the gate electrodes 210a, 210b, and 210c. The charge storing structures 230 may extend along outer sidewalls of the vertical channel portions VC or in the third direction Z. For example, the charge storing structures 230 may have a shape surrounding or on the outer sidewalls of the vertical channel portions VC. The charge storing structures 230 may be formed of or include at least one of, for example, silicon oxide, silicon nitride, silicon oxynitride, or high-k dielectric materials and may have a single- or multi-layered structure.

As shown in FIG. 6A, each of the charge storing structures 230 may include, for example, a tunnel insulating layer TL, a blocking insulating layer BLL and a charge storing layer CTL. The tunnel insulating layer TL may be disposed adjacent to each of the vertical channel portions VC to enclose the outer sidewall of the vertical channel portion VC. The blocking insulating layer BLL may be disposed adjacent to the gate electrodes 210a, 210b, and 210c. The charge storing layer CTL may be disposed between the tunnel insulating layer TL and the blocking insulating layer BLL. The tunnel insulating layer TL may be formed of or include at least one of, for example, silicon oxide or high-k dielectric materials (e.g., aluminum oxide ($Al_2O_3$) or hafnium oxide ($HfO_2$)). The blocking insulating layer BLL may be formed of or include at least one of, for example, silicon oxide or high-k dielectric materials (e.g., aluminum oxide ($Al_2O_3$) or hafnium oxide ($HfO_2$)). The charge storing layer CTL may be formed of or include, for example, silicon nitride.

Horizontal insulating layers PL may be disposed between the charge storing structures 230 and the stack ST. The horizontal insulating layers PL may be provided to surround or be on outer sidewalls of the charge storing structures 230. The horizontal insulating layers PL may be in physical contact with the cell and string selection gate electrodes 210b and 210c and the insulating patterns 220. The horizontal insulating layers PL may be formed of or include at least one of high-k dielectric materials (e.g., aluminum oxide ($Al_2O_3$) or hafnium oxide ($HfO_2$)).

Gap-fill layers 240 may be disposed in internal spaces of the vertical channel portions VC. The gap-fill layers 240 may be formed of or include at least one of, for example, silicon oxide, silicon nitride, or silicon oxynitride. Pads 250 may be disposed on the vertical channel portions VC, the charge storing structures 230, and the gap-fill layers 240. The pads 250 may include a conductive material or a semiconductor material, which may be doped to have a conductivity type different from the vertical channel portions VC. The pads 250 may be electrically connected to the vertical channel portions VC.

A common source contact plug CSP may be disposed between the stacks ST adjacent to each other in the second direction Y. The common source contact plug CSP may extend in the first direction X, with the stacks ST interposed therebetween. The common source contact plug CSP may be disposed in the substrate 100 and may be electrically connected to a common source region CSR extending in the first direction X. The common source contact plug CSP may be formed of or include at least one of, for example, metal materials (tungsten, copper, or aluminum) or transition metal materials (titanium or tantalum). The common source region CSR may have a conductivity type different from the substrate 100. Spacers 390 may be disposed between the common source contact plug CSP and each of the stacks ST. As an example, the spacers 390 may be disposed between the common source contact plug CSP and the gate electrodes 210a, 210b, and 210c, which are provided on the cell array region CAR of the substrate 100.

Edge insulating patterns 310 may be disposed between the ground selection and cell gate electrodes 210a and 210b and the common source contact plug CSP. The edge insulating patterns 310 may be disposed between the ground selection and cell gate electrodes 210a and 210b and each of the spacers 390. The edge insulating patterns 310 may be disposed between the buffer insulating pattern 201 and the lowermost insulating pattern 220 (i.e., the insulating pattern 220 closest to the substrate 100) and between the insulating patterns 220 adjacent to each other in the third direction Z.

Each of the edge insulating patterns 310 may be placed at the same level relative to the upper surface of the substrate 100 as a corresponding one of the ground selection and cell gate electrodes 210a and 210b. The edge insulating patterns 310 may be disposed on the cell array region CAR and the pad region PR of the substrate 100. At each level, each pair of the edge insulating patterns 310 may be spaced apart from each other in the second direction Y with a corresponding one of the ground selection and cell gate electrodes 210a and 210b interposed therebetween. The edge insulating pattern 310 may not be disposed between the string selection gate electrode 210c and the common source contact plug CSP.

Each of the edge insulating patterns 310 may be disposed between the first and second portions PA1 and PA2 of each of the gate electrodes 210a, 210b, and 210c and on sidewalls of the third portion PA3. As shown in FIG. 6B, the sidewalls of the third portion PA3 may be concave. Each of the edge insulating patterns 310 may pass through a space between the first and second portions PA1 and PA2 of each of the gate electrodes 210a, 210b, and 210c. Each of the edge insulating patterns 310 may vertically overlap the second portions PA2 of the cell gate electrodes 210b and/or the string selection gate electrode 210c stacked thereon in the Z direction in a plan view. For example, the uppermost one of the edge insulating patterns 310 (i.e., the edge insulating pattern 310 farthest from the substrate 100) may vertically overlap the second portion PA2 of the string selection gate electrode 210c in the Z direction in a plan view. For example, the lowermost one of the edge insulating patterns 310 (i.e., the edge insulating pattern 310 closest to the substrate 100) may vertically overlap the second portions PA2 of the cell and string selection gate electrodes 210b and 210c in the Z direction in a plan view.

Lengths of the edge insulating patterns 310 in the first direction X may decrease with increasing distance from the substrate 100. For example, the lowermost one of the edge insulating patterns 310 (i.e., the edge insulating pattern 310 closest to the substrate 100) may be the longest in the X direction, and the uppermost one of the edge insulating patterns 310 (i.e., the edge insulating pattern 310 farthest from the substrate 100) may be the shortest in the X direction. When measured in the first direction X, the length of each of the edge insulating patterns 310 may be substantially the same as that of a corresponding one of the cell and string selection gate electrodes 210b and 210c directly disposed thereon. For example, the length of the lowermost edge insulating pattern 310 in the first direction X may be substantially equal to the length of the lowermost cell gate electrode 210b in the first direction X. In addition, the length of the uppermost edge insulating pattern 310 (i.e., the edge insulating pattern 310 farthest from the substrate 100) in the first direction X may be substantially equal to the length of the string selection gate electrode 210c in the first direction X.

In some embodiments, each of the edge insulating patterns 310 may have a first side surface S1 and a second side surface S2, which are in physical contact with a corresponding one of the ground selection and cell gate electrodes 210a and 210b located at the same level. On the pad region PR of the substrate 100, the first side surface S1 of each of the edge insulating patterns 310 may be aligned to a side surface S3 of a corresponding one of the cell and string selection gate electrodes 210b and 210c directly located thereon. The second side surface S2 of each of the edge insulating patterns 310 may be interposed between a corresponding pair of the insulating patterns 220, which are adjacent to each other in the third direction Z. For example, the second side surface S2 may be laterally recessed from side surfaces of the insulating patterns 220 in contact with the spacers 390. The first and second side surfaces S1 and S2 of each of the edge insulating patterns 310 may have a convexly curved shape. Referring to FIGS. 2 and 6B, widths W1, in the second direction Y, of the first portions PA1 of the ground selection and cell gate electrodes 210a and 210b, which are provided on the cell array region CAR of the substrate 100, may be greater than widths W2, in the second direction Y, of the third portions PA3 of the ground selection and cell gate electrodes 210a and 210b (i.e., W1>W2). The widths, in the second direction Y, of the second portions PA2 of the ground selection, cell, and string selection gate electrodes 210a, 210b, and 210c may be substantially equal to the widths W1 of the first portions PA1.

A protective interlayered insulating layer 330 may be interposed between the common source contact plug CSP and each of the stacks ST. The protective interlayered insulating layer 330 may be interposed between each of the spacers 390 and each of the stacks ST. The protective interlayered insulating layer 330 may be provided not only to cover or be on side surfaces of the end portions (or the second portions PA2) of the gate electrodes 210a, 210b, and 210c adjacent to the common source contact plug CSP but also to cover or be on side and top surfaces of the insulating patterns 220, which cover or are on the end portions of the gate electrodes 210a, 210b, and 210c in the cell array region CAR. The protective interlayered insulating layer 330 may cover or be on the stepwise structure of the stacks ST. The protective interlayered insulating layer 330 may cover or be on a top surface of the uppermost one of the insulating patterns 220 (i.e., the insulating pattern 220 that is farthest from the substrate 100) and the pads 250, on the substrate 100 the cell array region CAR. The protective interlayered insulating layer 330 may be formed of or include, for example, silicon oxide.

Supporting pillars 335 may be disposed on the pad region PR of the substrate 100. The supporting pillars 335 may be provided to penetrate the stepwise structure of each of the stacks ST. For example, the supporting pillars 335 may be provided to penetrate the protective interlayered insulating layer 330, the second portions PA2 of the gate electrodes 210a, 210b, and 210c, the insulating patterns 220 covering or on the second portions PA2 of the gate electrodes 210*a*, 210*b*, and 210*c*, the buffer insulating patterns 201, and the edge insulating patterns 310. The supporting pillars 335 may be in physical contact with the top surface of the substrate 100. When viewed in a plan view, the supporting pillars 335 may be disposed near at least one of corners of the second portions PA2 of the gate electrodes 210*a*, 210*b*, and 210*c*. The supporting pillars 335 may be formed of or include at least one of silicon oxide, silicon nitride, or silicon oxynitride. In an embodiment, the supporting pillars 335 may be formed of a single monolithic layer.

First and second interlayered insulating layers 340 and 350 may be sequentially stacked on the protective interlayered insulating layer 330. The first and second interlayered insulating layers 340 and 350 may be pierced by the common source contact plug CSP. The first interlayered insulating layer 340 may be formed of or include, for example, silicon oxide. The second interlayered insulating layers 350 may be formed of or include at least one of, for example, silicon oxide, silicon nitride, or silicon oxynitride. A third interlayered insulating layer 360 may be disposed on the second interlayered insulating layer 350. The third interlayered insulating layer 360 may cover or be on a top surface of the second interlayered insulating layer 350 and a top surface of the common source contact plug CSP. The third interlayered insulating layer 360 may be formed of or include at least one of, for example, silicon oxide, silicon nitride, or silicon oxynitride.

Cell contact plugs CCP may be provided to penetrate the second portions PA2 of the gate electrodes 210*a*, 210*b*, and 210*c*. For example, each of the cell contact plugs CCP may be provided to penetrate a corresponding one of the gate electrodes 210*a*, 210*b*, and 210*c* electrically connected thereto. In some embodiments, each of the cell contact plugs CCP may be provided to penetrate the edge insulating patterns 310 and the insulating patterns 220, which are disposed below the corresponding one of the gate electrodes 210*a*, 210*b*, and 210*c* electrically connected thereto. In some embodiments, the closer the gate electrode connected to the cell contact plug CCP is to the substrate 100, the longer the length of the cell contact plug CCP. For example, the length of the cell contact plug CCP penetrating the second portion PA2 of only the string selection gate electrode 210*c* may be shorter than other ones of the cell contact plugs CCP in the Z direction, and the length of the cell contact plug CCP penetrating the second portion PA2 of the ground selection gate electrode 210*a* may be longer than other ones of the cell contact plugs CCP in the Z direction. In some embodiments, the cell contact plug CCP penetrating the end portion of the ground selection gate electrode 210*a* may extend into the insulating gapfill layer 101. In this case, the bottom of the cell contact plug CCP penetrating the second portion PA2 of the ground selection gate electrode 210*a* may be located below the top surface of the substrate 100. The cell contact plugs CCP may be formed of or include at least one of, for example, metals (e.g., copper, tungsten, or aluminum) and/or metal nitrides (e.g., tantalum nitride, titanium nitride, or tungsten nitride).

According to some embodiments of the inventive concept, a conductive material (e.g., the conductive material constituting the gate electrodes) may not be provided below the end portions of the gate electrodes 210*a*, 210*b*, and 210*c*, which are provided on the pad region PR of the substrate 100. Because the end portions of the string selection and cell gate electrodes 210*c* and 210*b* do not vertically overlap the gate electrodes thereunder in a Z direction, it may be possible to prevent or reduce the likelihood of the cell contact plug CCP from making contact with other gate electrodes, even when the cell contact plug CCP is formed to penetrate the end portion of a desired one of the string selection and cell gate electrodes 210*c* and 210*b*. This may make it possible to improve reliability of a three-dimensional semiconductor memory device.

A fourth interlayered insulating layer 370 may be disposed on the third interlayered insulating layer 360. The fourth interlayered insulating layer 370 may cover or be on top surfaces of the cell contact plugs CCP. The fourth interlayered insulating layer 370 may be formed of or include at least one of, for example, silicon oxide, silicon nitride, or silicon oxynitride.

Channel contact plugs HCP may be provided on the pads 250, and sub-contact plugs STD may be provided on the cell contact plugs CCP. The channel contact plugs HCP may be provided to penetrate the first to fourth interlayered insulating layers 340, 350, 360, and 370 and the protective interlayered insulating layer 330. The sub-contact plugs STD may be provided to penetrate the fourth interlayered insulating layer 370. The channel contact plugs HCP and the sub-contact plugs STD may be formed of or include at least one of, for example, metal materials or metal silicides.

Bit lines BL and interconnection lines 400 may be formed on the fourth interlayered insulating layer 370. The bit lines BL may be electrically connected to the channel contact plugs HCP, and the interconnection lines 400 may be electrically connected to the cell contact plugs CCP via the sub-contact plugs STD.

Figure 7:
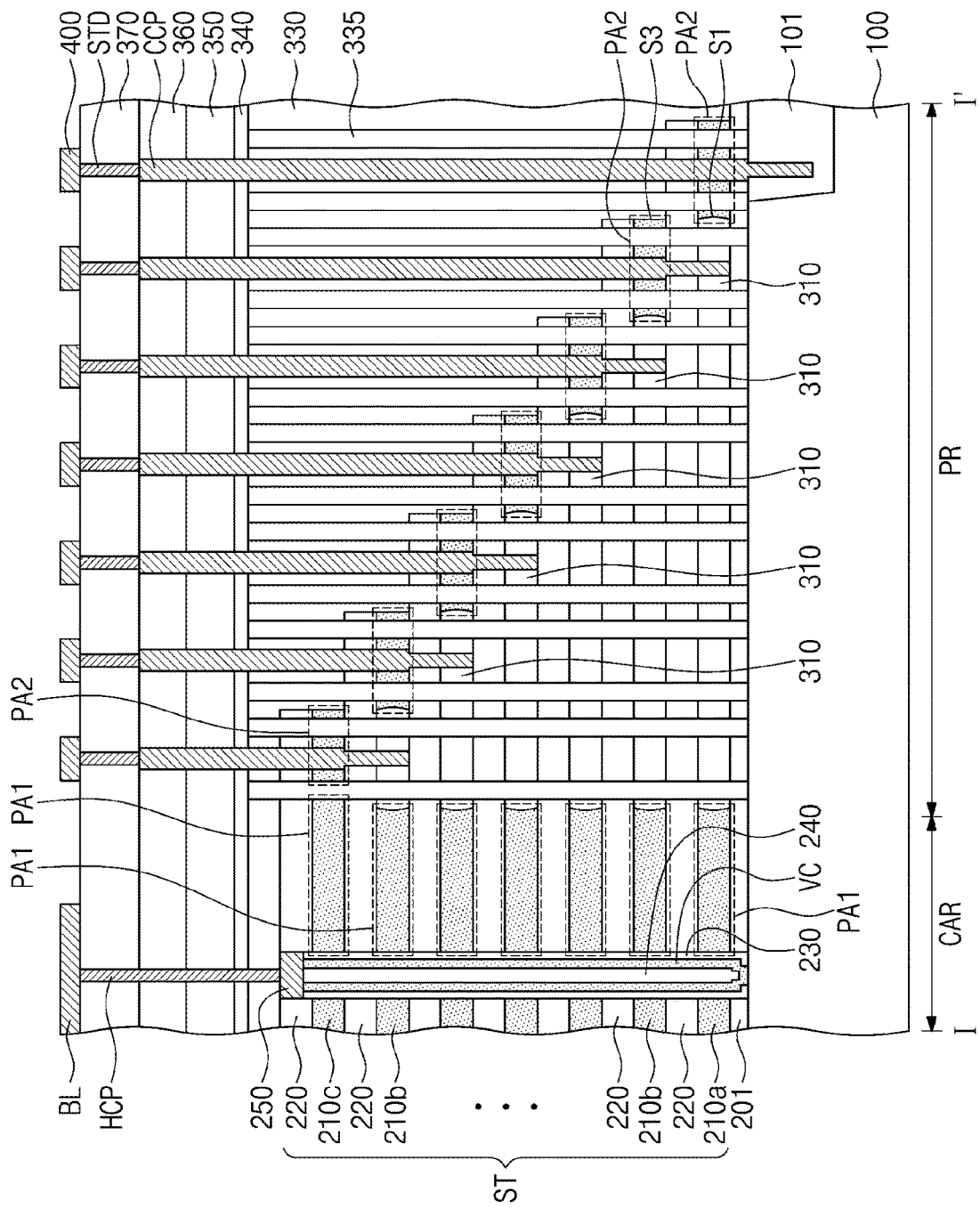
FIG. 7 is a sectional view, which is taken along a line I-I' of FIG. 2 to illustrate a three-dimensional semiconductor memory device according to some embodiments of the inventive concept.

FIG. 7 is a sectional view, which is taken along a line I-I' of FIG. 2 to illustrate a three-dimensional semiconductor memory device according to some embodiments of the inventive concept.

Referring to FIG. 7, the vertical channel portions VC and the charge storing structures 230 may be in physical contact with the top surface of the substrate 100. That is, the semiconductor pillars SP of FIG. 3 may be omitted in some embodiments of the inventive concept.

Figure 8:
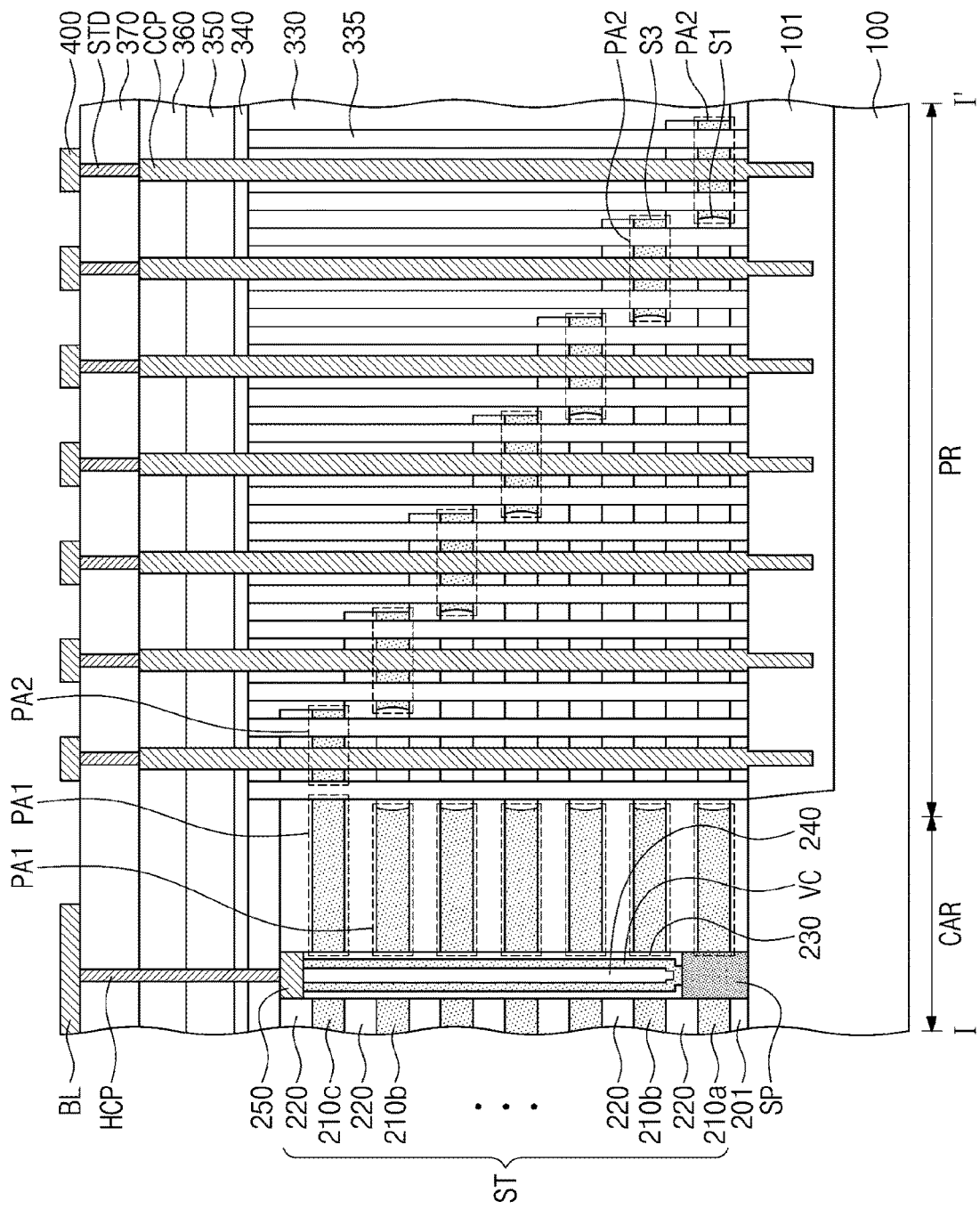
FIG. 8 is a sectional view, which is taken along a line I-I' of FIG. 2 to illustrate a three-dimensional semiconductor memory device according to some embodiment of the inventive concept.

FIG. 8 is a sectional view, which is taken along a line I-I' of FIG. 2 to illustrate a three-dimensional semiconductor memory device according to some embodiments of the inventive concept.

Referring to FIG. 8, each of the cell contact plugs CCP may be provided to penetrate the edge insulating patterns 310 and the insulating patterns 220, which are disposed below, relative to the substrate 100, the corresponding one of the gate electrodes 210*a*, 210*b*, and 210*c* electrically connected thereto. The cell contact plugs CCP may include lower portions that are inserted into the insulating gapfill layer 101. For example, the cell contact plugs CCP may penetrate the end portions of the ground selection, cell, and string selection gate electrodes 210*a*, 210*b*, and 210*c* and may be inserted into the insulating gapfill layer 101. In some embodiments, the cell contact plugs CCP may have substantially the same length.

Figure 9:
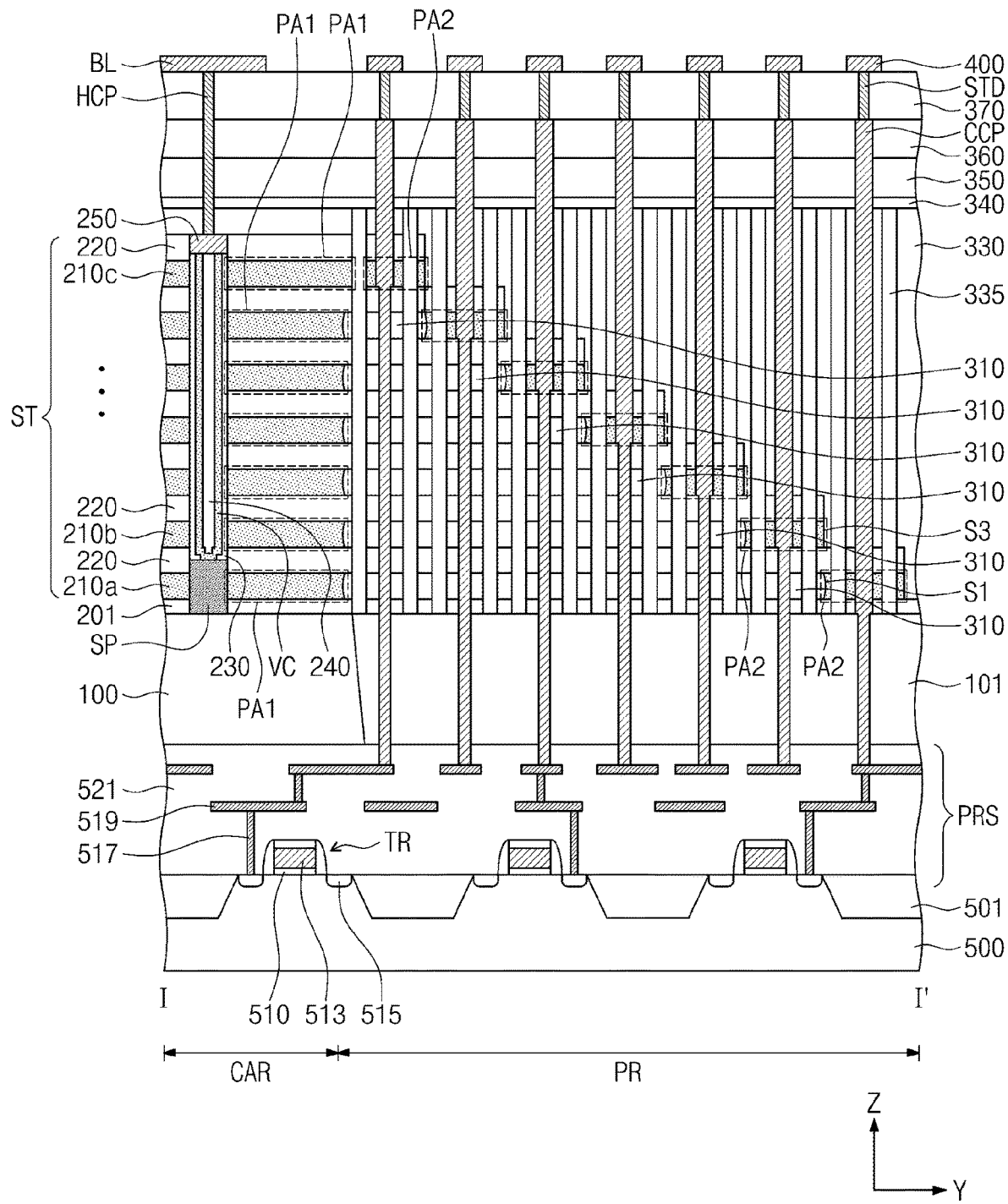
FIG. 9 is a sectional view, which is taken along a line I-I' of FIG. 2 to illustrate a three-dimensional semiconductor memory device according to some embodiments of the inventive concept.
Figure 10:
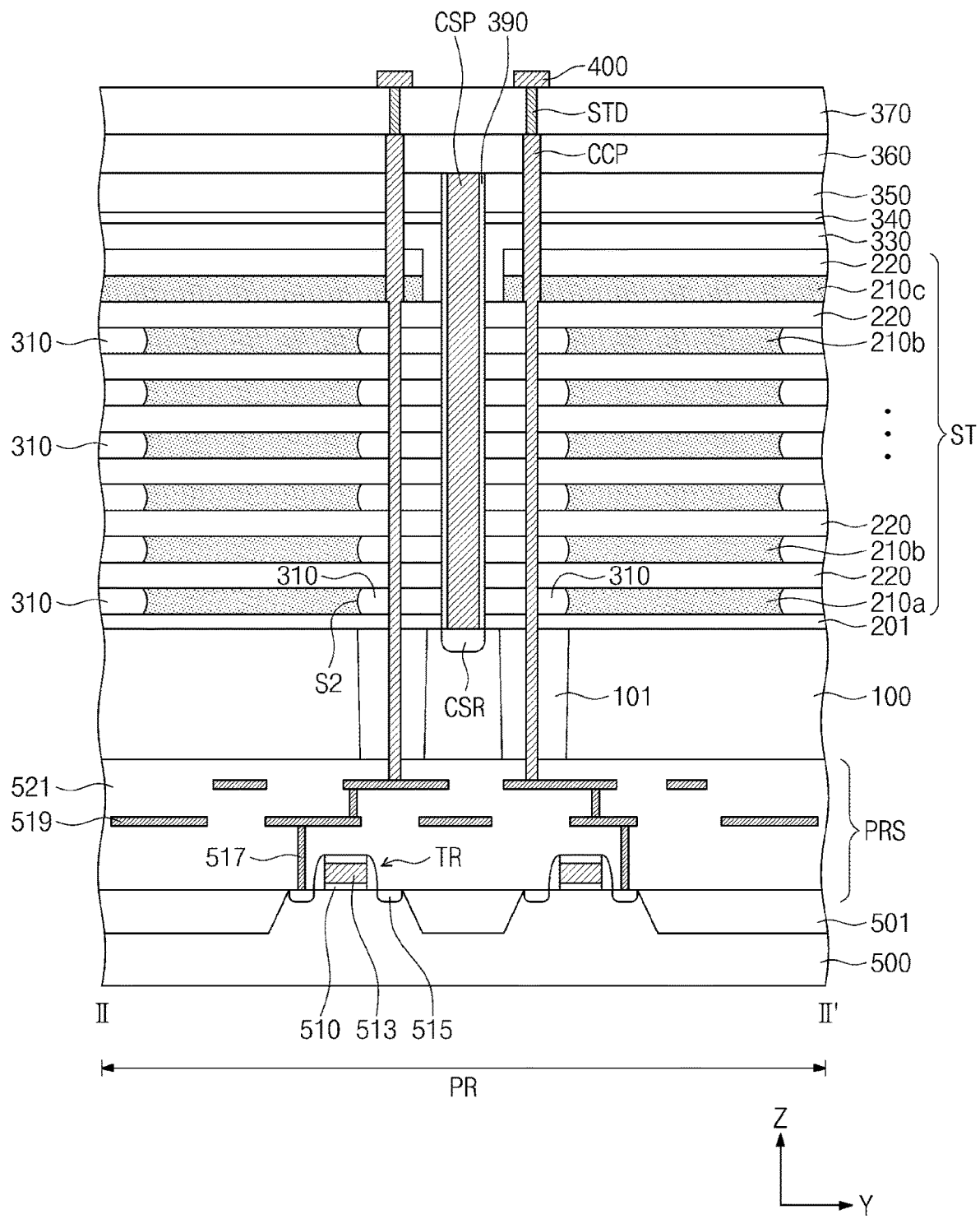
FIG. 10 is a sectional view, which is taken along a line II-II' of FIG. 2 to illustrate a three-dimensional semiconductor memory device according to some embodiments of the inventive concept.
Figure 11:
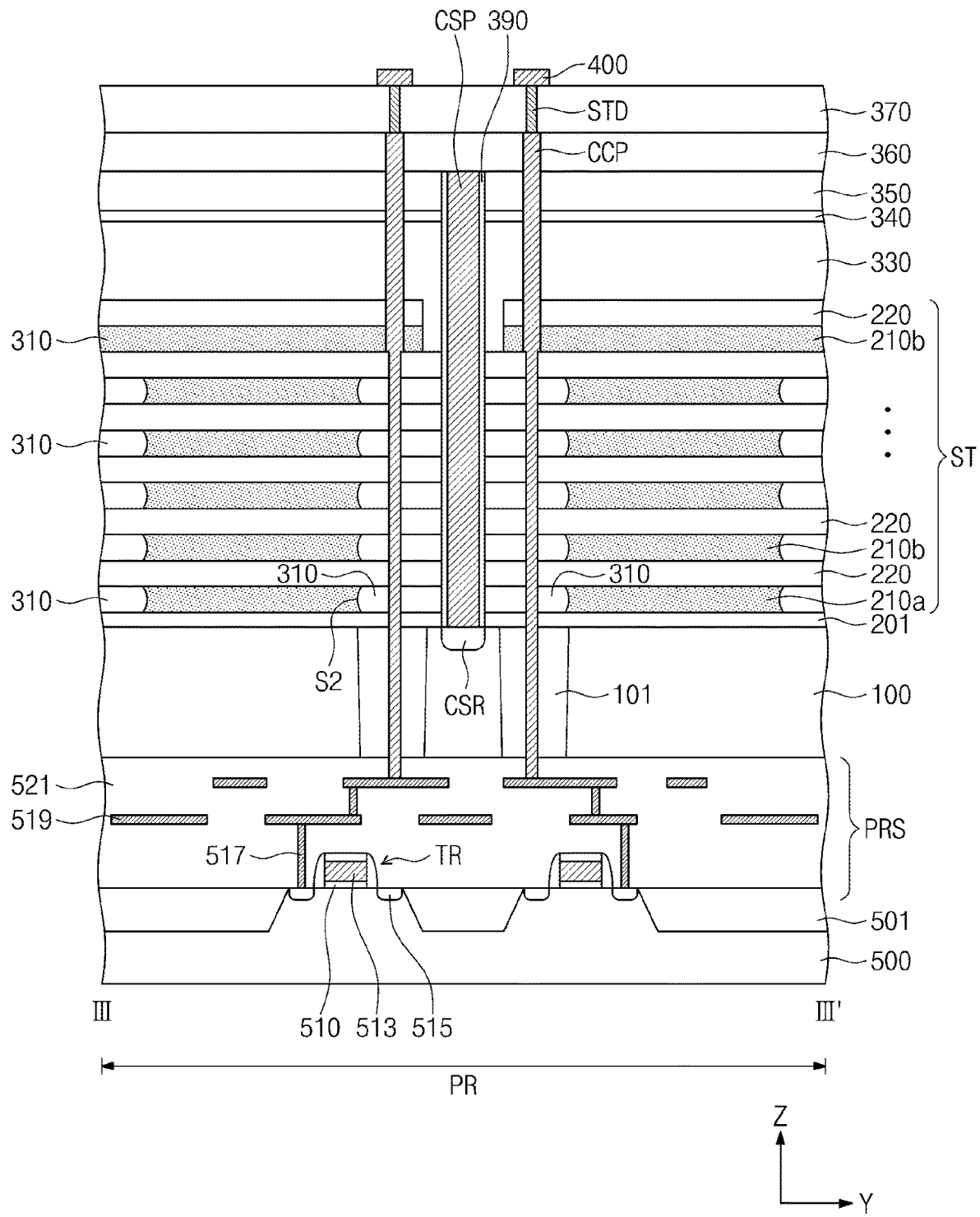
FIG. 11 is a sectional view, which is taken along a line III-III' of FIG. 2 to illustrate a three-dimensional semiconductor memory device according to some embodiments of the inventive concept.

FIG. 9 is a sectional view, which is taken along a line I-I' of FIG. 2 to illustrate a three-dimensional semiconductor memory device according to some embodiments of the inventive concept. FIG. 10 is a sectional view, which is taken along a line II-II' of FIG. 2 to illustrate a three-dimensional semiconductor memory device according to some embodiments of the inventive concept. FIG. 11 is a sectional view, which is taken along a line III-III' of FIG. 2 to illustrate a three-dimensional semiconductor memory device according to some embodiments of the inventive concept.

Referring to FIGS. 9 to 11, a lower substrate 500 may be provided below the substrate 100 (i.e., the substrate 100 is between the lower substrate 500 and the stacks ST), and a peripheral circuit structure PRS may be disposed between the lower substrate 500 and the substrate 100. The lower substrate 500 may be, for example, a silicon substrate, a silicon-germanium substrate, a germanium substrate, or a poly- or single-crystalline epitaxial layer grown on a single-crystalline silicon substrate. A device isolation layer 501 may be disposed in the lower substrate 500. The device isolation layer 501 may define active regions in the lower substrate 100. The peripheral circuit structure PRS may include transistors TR, interconnection lines 519, vias 517, and a peripheral circuit interlayered insulating layer 521. The transistors TR may be formed on the active regions of the lower substrate 500. The transistors TR may include a peripheral gate insulating layer 510, a peripheral gate electrode 513, and source/drain regions 515. The peripheral gate insulating layer 510 and the peripheral gate electrode 513 may be sequentially formed on the lower substrate 500. The source/drain regions 515 may be formed in each of the active regions of the lower substrate 500 and at both sides of the peripheral gate electrode 513. The peripheral circuit interlayered insulating layer 521 may be disposed between the lower substrate 500 and the substrate 100. The peripheral circuit interlayered insulating layer 521 may be formed to cover or be on the transistors TR. The peripheral circuit interlayered insulating layer 521 may be formed of or include, for example, silicon oxide. The interconnection lines 519 and the vias 517 may be formed in the peripheral circuit interlayered insulating layer 521.

The insulating gapfill layer 101 may be disposed between the pad region PR of the substrate 100 and the peripheral circuit structure PRS. The insulating gapfill layer 101 may be provided to penetrate the substrate 100. A bottom surface of the insulating gapfill layer 101 may be in physical contact with the peripheral circuit interlayered insulating layer 521. A top surface of the insulating gapfill layer 101 may be located at the same level as the upper surface of the substrate 100 in a cross-sectional view. The cell contact plugs CCP may be provided to penetrate the gate electrodes 210a, 210b, and 210c, the insulating patterns 220, the edge insulating patterns 310, and the insulating gapfill layer 101. The cell contact plugs CCP may be in physical contact with the interconnection lines 519 disposed in the peripheral circuit interlayered insulating layer 521. Thus, the cell contact plugs CCP may be electrically connected to the transistors TR via the interconnection lines 519 and the vias 517.

FIGS. 12A to 17A, and 19A are sectional views, each of which is taken along a line I-I' of FIG. 2 to illustrate a three-dimensional semiconductor memory device according to some embodiments of the inventive concept. FIGS. 12B to 17B, 18A, and 19B are sectional views, each of which is taken along a line II-II' of FIG. 2 to illustrate a three-dimensional semiconductor memory device according to some embodiments of the inventive concept. FIGS. 12C to 17C, 18B, and 19C are sectional views, each of which is taken along a line III-III' of FIG. 2 to illustrate a three-dimensional semiconductor memory device according to some embodiments of the inventive concept.

Figure 12A:
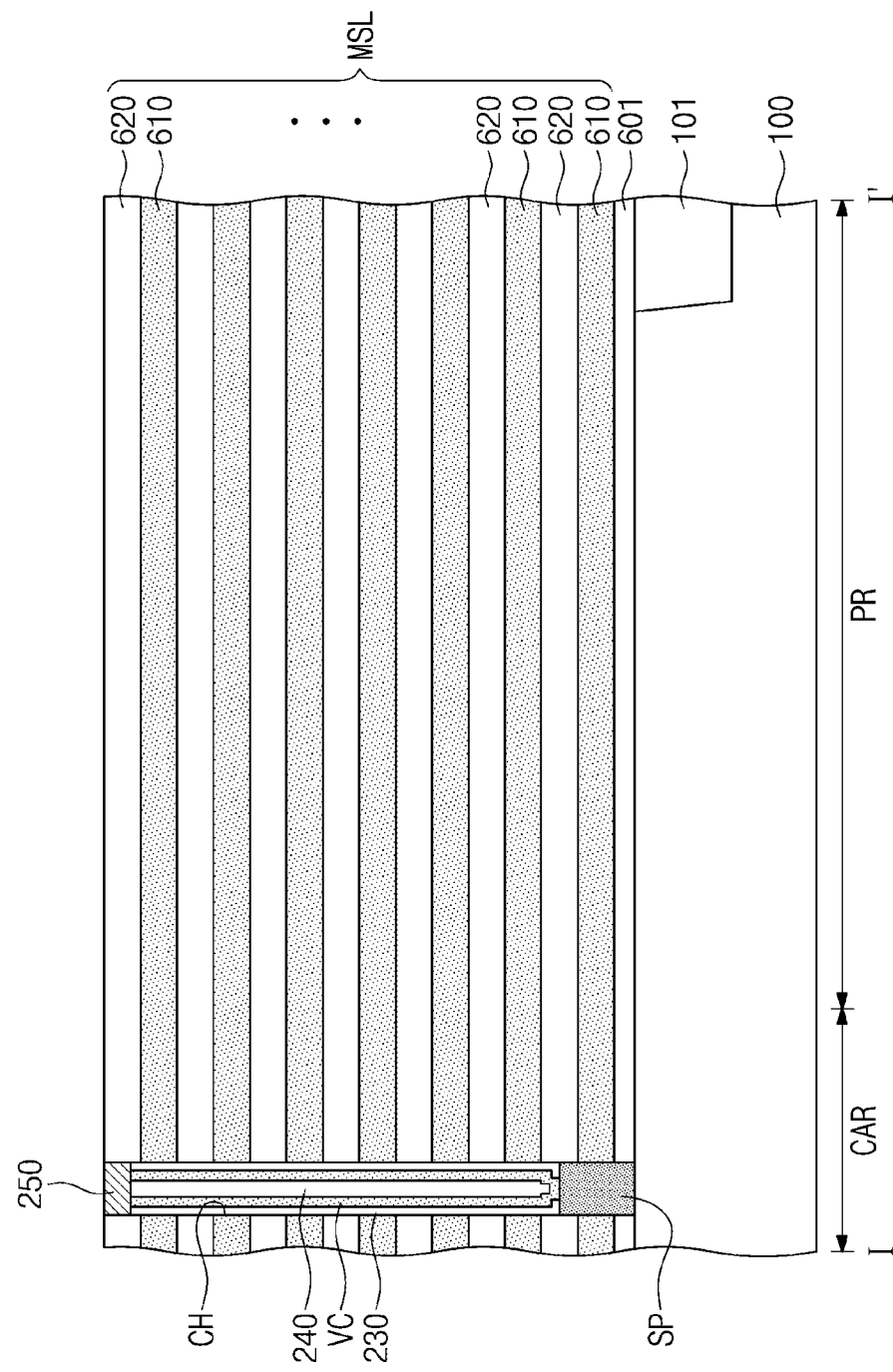
Figure 12B:
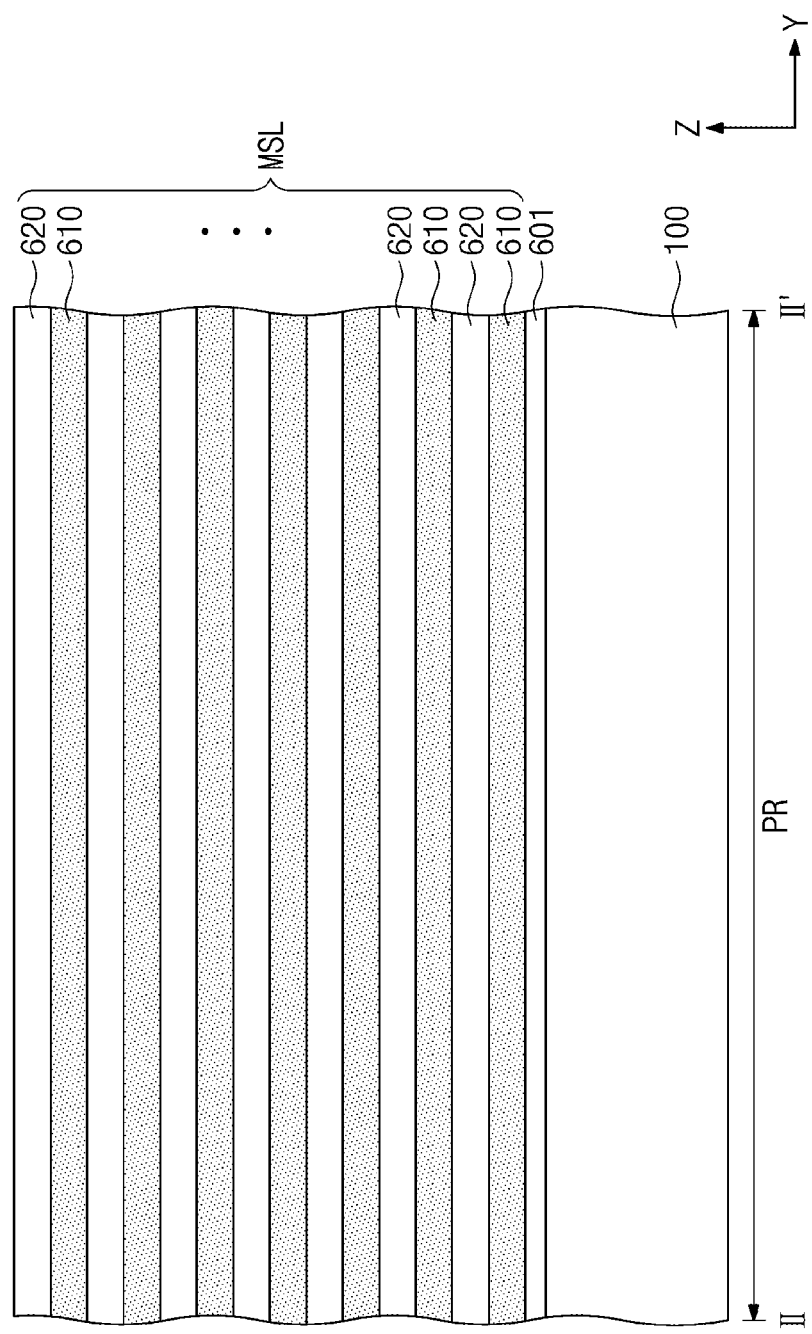
Figure 12C:
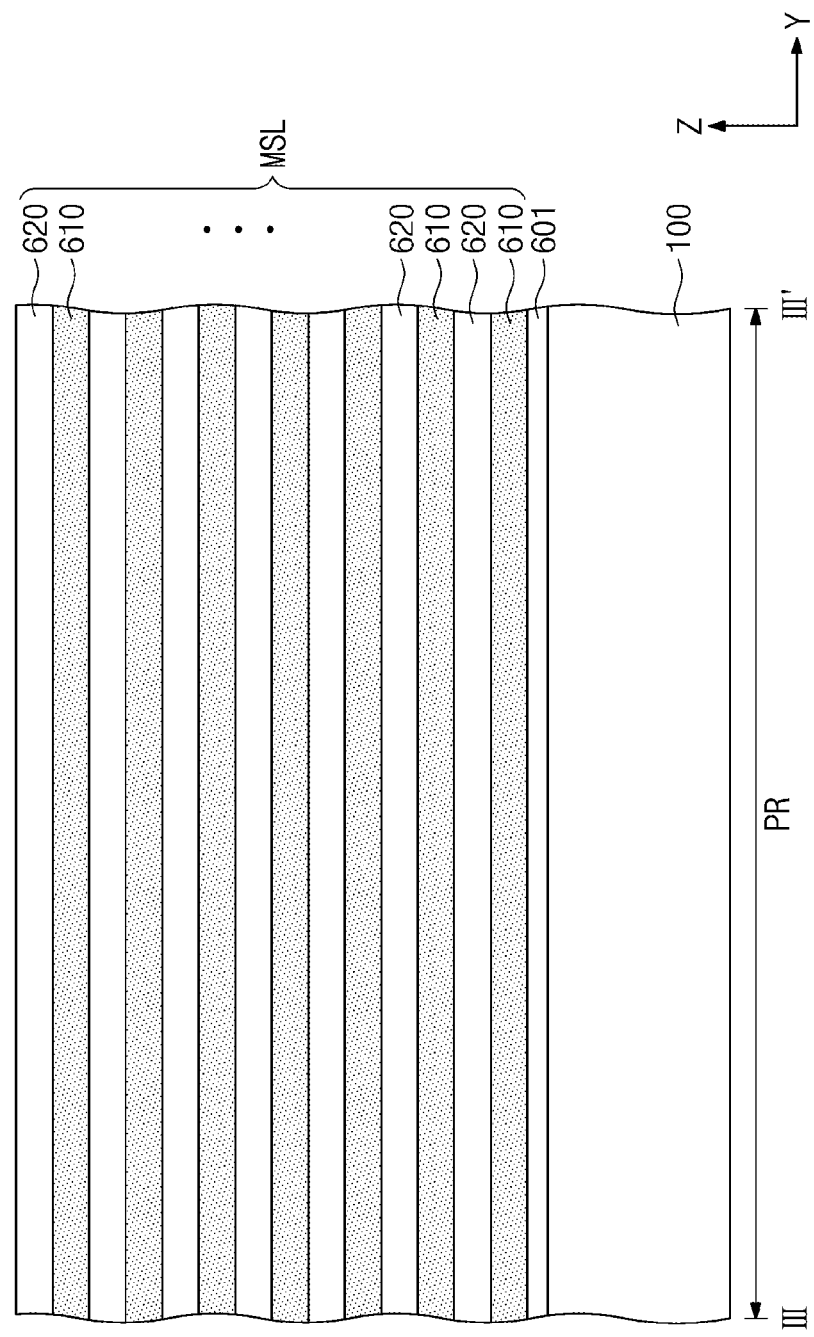

Referring to FIGS. 12A, 12B, and 12C, a buffer insulating layer 601 may be formed on the substrate 100. A stack layer MSL may be formed on the buffer insulating layer 601. The substrate 100 may include the cell array region CAR and the pad region PR. The buffer insulating layer 601 may cover or be on the top surface of the substrate 100. The insulating gapfill layer 101 may be formed in the substrate 100. As an example, the insulating gapfill layer 101 may be formed in the pad region PR of the substrate 100. The formation of the insulating gapfill layer 101 may include forming a trench in the pad region PR of the substrate 100 and filling the trench, in whole or in part, with an insulating material. The stack layer MSL may include conductive layers 610 and insulating layers 620. The conductive layers 610 and the insulating layers 620 may be alternately and repeatedly stacked on the buffer insulating layer 601. The conductive layers 610 may be formed of or include at least one of, for example, semiconductor materials (e.g., poly silicon) or metal materials (e.g., tungsten). The insulating layers 620 may be formed of or include, for example, silicon oxide.

Channel holes CH may be formed on the cell array region CAR of the substrate 100 by patterning the stack layer MSL. For example, the formation of the channel holes CH may include forming a mask pattern (not shown) on the stack layer MSL and anisotropically etching the stack layer MSL using the mask pattern as an etch mask. Owing to an over-etching, the upper surface of the substrate 100 may be partially recessed. When viewed in a plan view, the channel holes CH may have one of elliptical, circular, or polygonal shapes.

The semiconductor pillars SP may be formed in the channel holes CH. The semiconductor pillars SP may be grown from the substrate 100 through a selective epitaxial growth process, in which the substrate 100 exposed by the channel holes CH is used as a seed layer. Referring to FIG. 6A, the horizontal insulating layers PL and the charge storing structure 230 may be formed on sidewalls of the channel holes CH. The horizontal insulating layers PL and the charge storing structures 230 may cover or be on the sidewalls of the channel holes CH and may cover or be on portions of the upper surface of the substrate 100 exposed by the channel holes CH. Each of the charge storing structures 230 may include the blocking insulating layer BLL, the charge storing layer CTL, and the tunnel insulating layer TL, which are sequentially formed on the sidewall of each channel hole CH. The blocking insulating layer BLL may cover or be on the sidewalls of the horizontal insulating layers PL.

The vertical channel portions VC may be formed in the channel holes CH. The vertical channel portions VC may conformally cover or be on inner surfaces of the charge storing structures 230 as well as the top surface of the substrate 100 exposed by the charge storing structures 230. The gap-fill layers 240 may be formed in the internal spaces of the vertical channel portions VC. The pads 250 may be formed in upper portions of the vertical channel portions VC, the charge storing structures 230, and the gap-fill layers 240. The formation of the pads 250 may include etching the upper portions of the vertical channel portions VC, the charge storing structures 230, and the gap-fill layers 240 to form recess regions and filling the recess regions with a conductive material. In some embodiments, the formation of the pads 250 may include doping the upper portions of the vertical channel portions VC with impurities having a different conductivity type from that of the vertical channel portions VC.

Figure 13A:
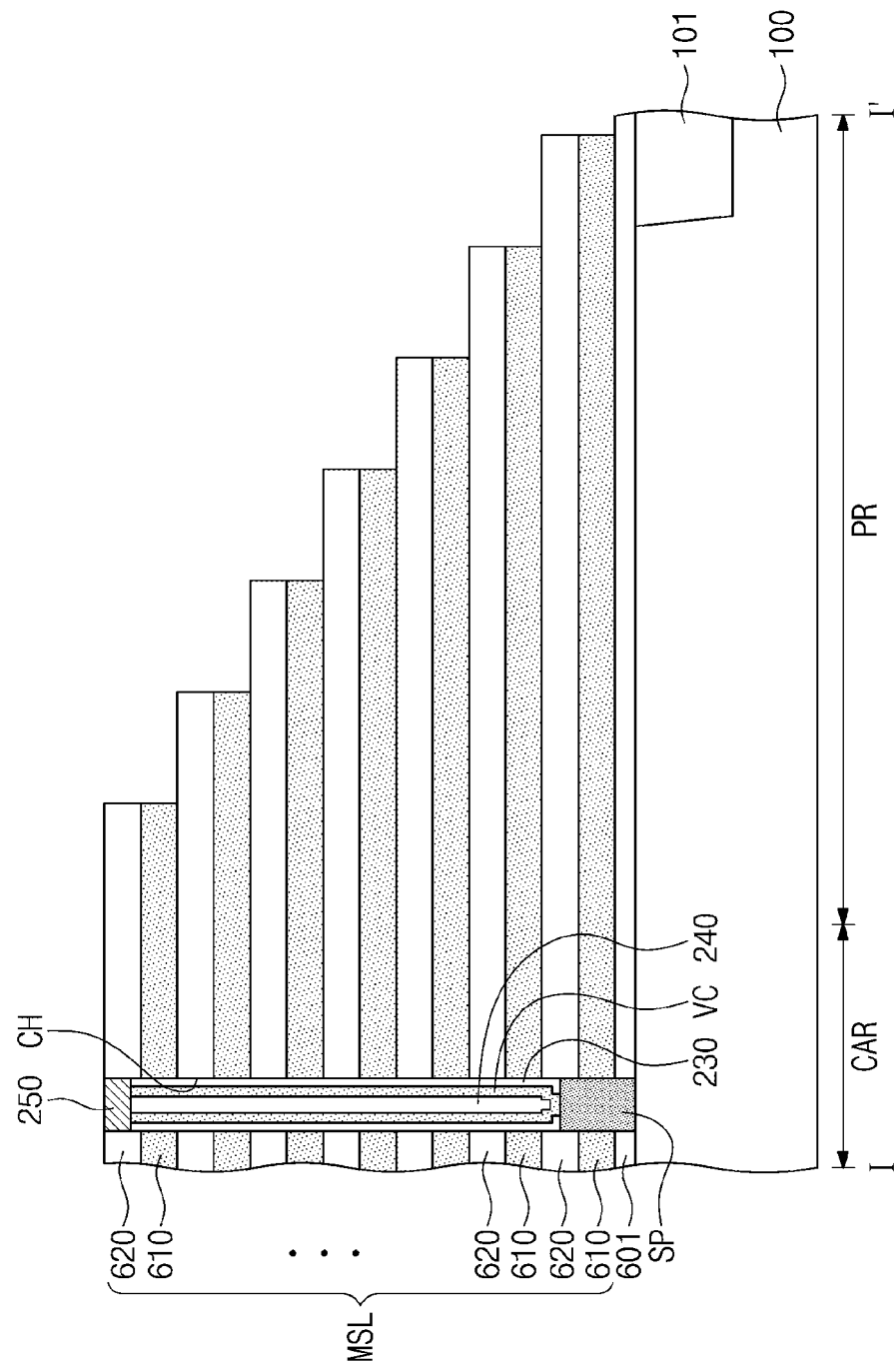
Figure 13B:
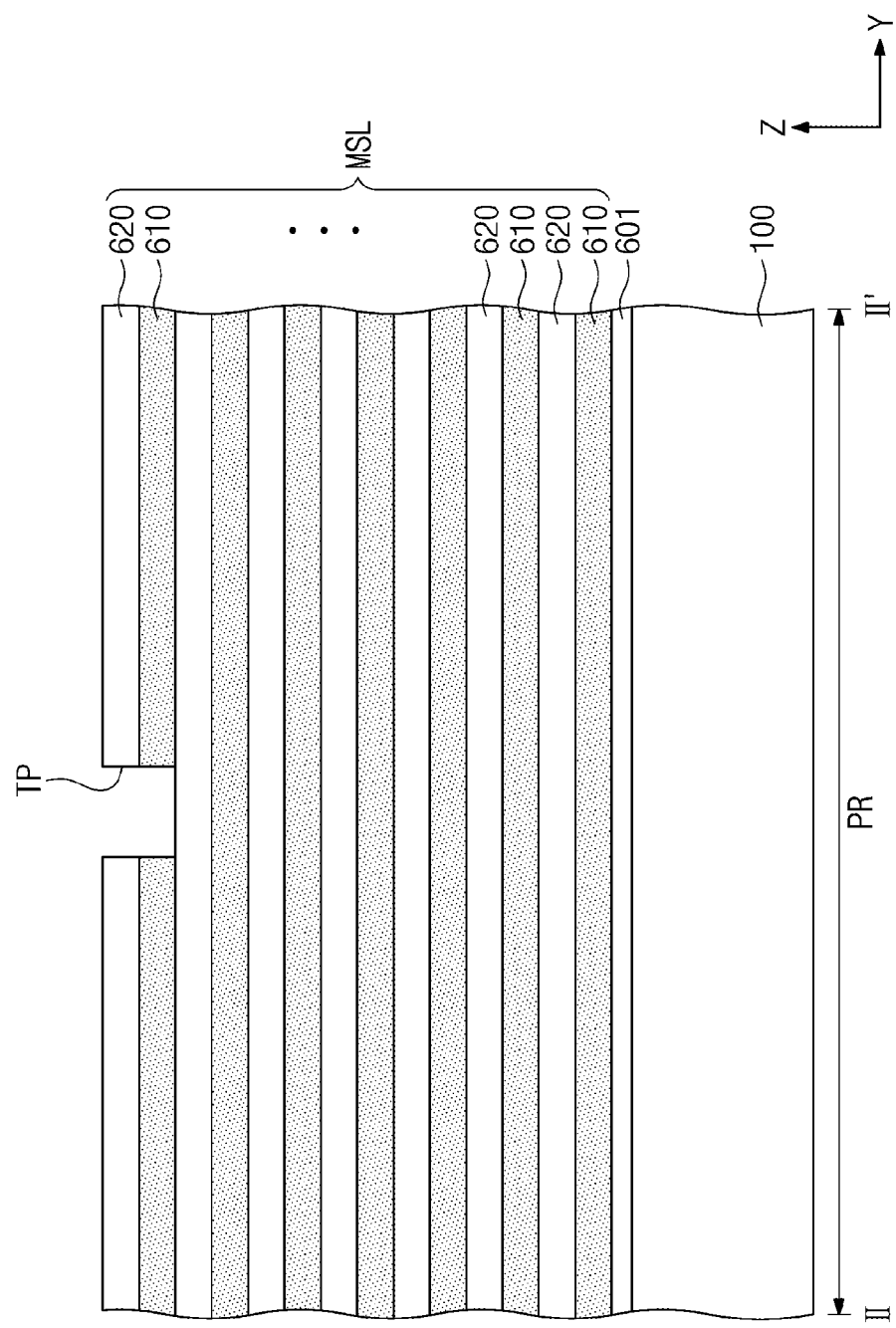
Figure 13C:
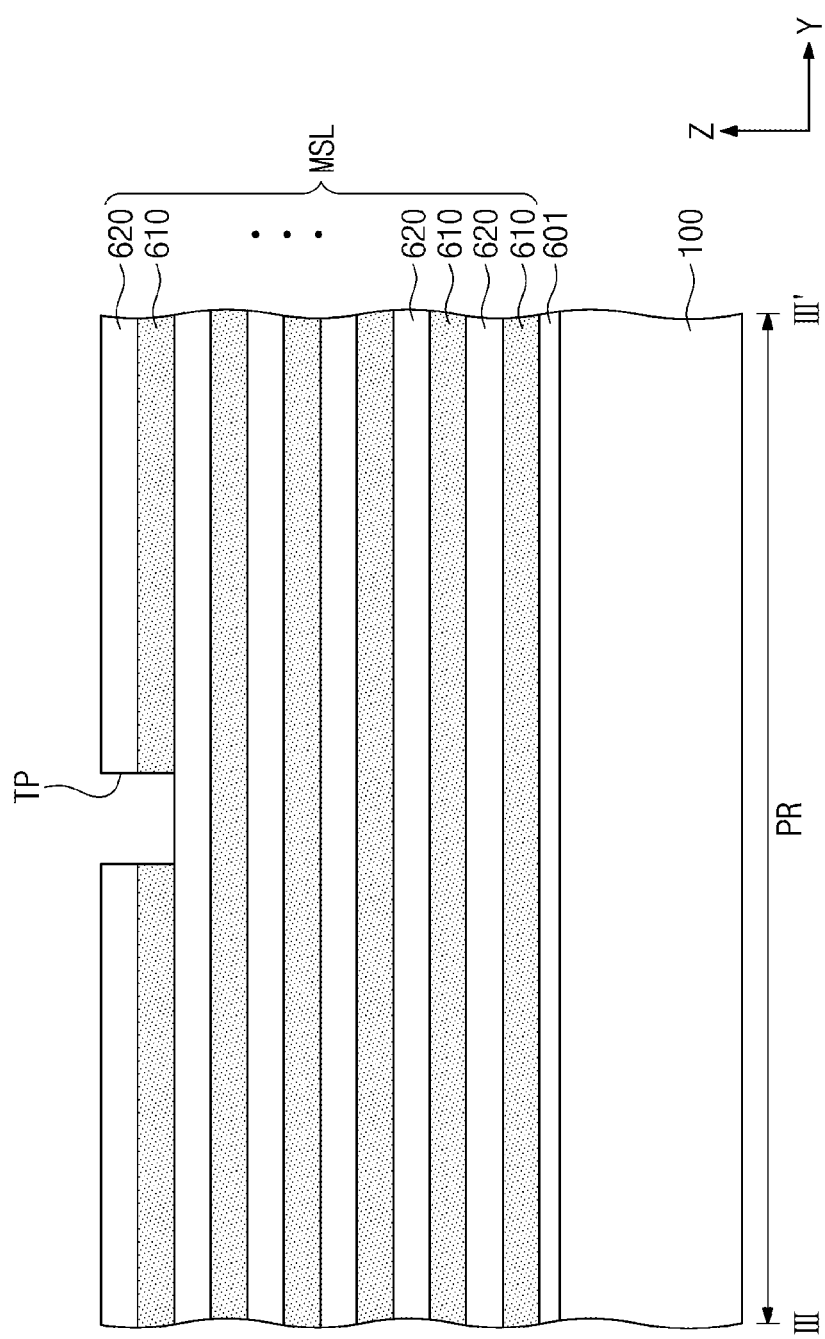

Referring to FIGS. 13A to 13C, the stack layer MSL formed on the pad region PR of the substrate 100 may be patterned to form a stepwise structure. The patterning of the stack layer MSL may include forming a mask pattern (not shown) on the stack layer MSL to expose a portion of the stack layer MSL formed on the pad region PR of the substrate 100, etching the insulating layers 620 and the conductive layers 610 using the mask pattern as an etch mask, and reducing a width of the mask pattern to increase a planar area of the insulating layers 620 and the conductive layers 610, and in some embodiments, the etching and width-reducing steps may be repeated at least two times. Top surfaces of the end portions of the insulating layers 620 may be exposed on the pad region PR of the substrate 100. Each of the end portions of the insulating layers 620 may cover or be on the end portion of each of the conductive layers 610 thereunder.

An upper opening TP may be formed in the stack layer MSL. The formation of the upper opening TP may include forming a mask pattern (not shown) on the stack layer MSL and etching the uppermost insulating and conductive layers 620 and 610 on the cell array region CAR, the end portions of a pair of the insulating and conductive layers 620 and 610 on the pad region PR being exposed by the mask pattern. Accordingly, the upper opening TP may be formed to extend from the cell array region CAR of the substrate 100 to the pad region PR in the first direction X. The upper opening TP may be formed in a region, in which the common source contact plug CSP shown in FIG. 2 will be formed. The etching process may be performed by using, for example, a dry etching process.

Figure 14A:
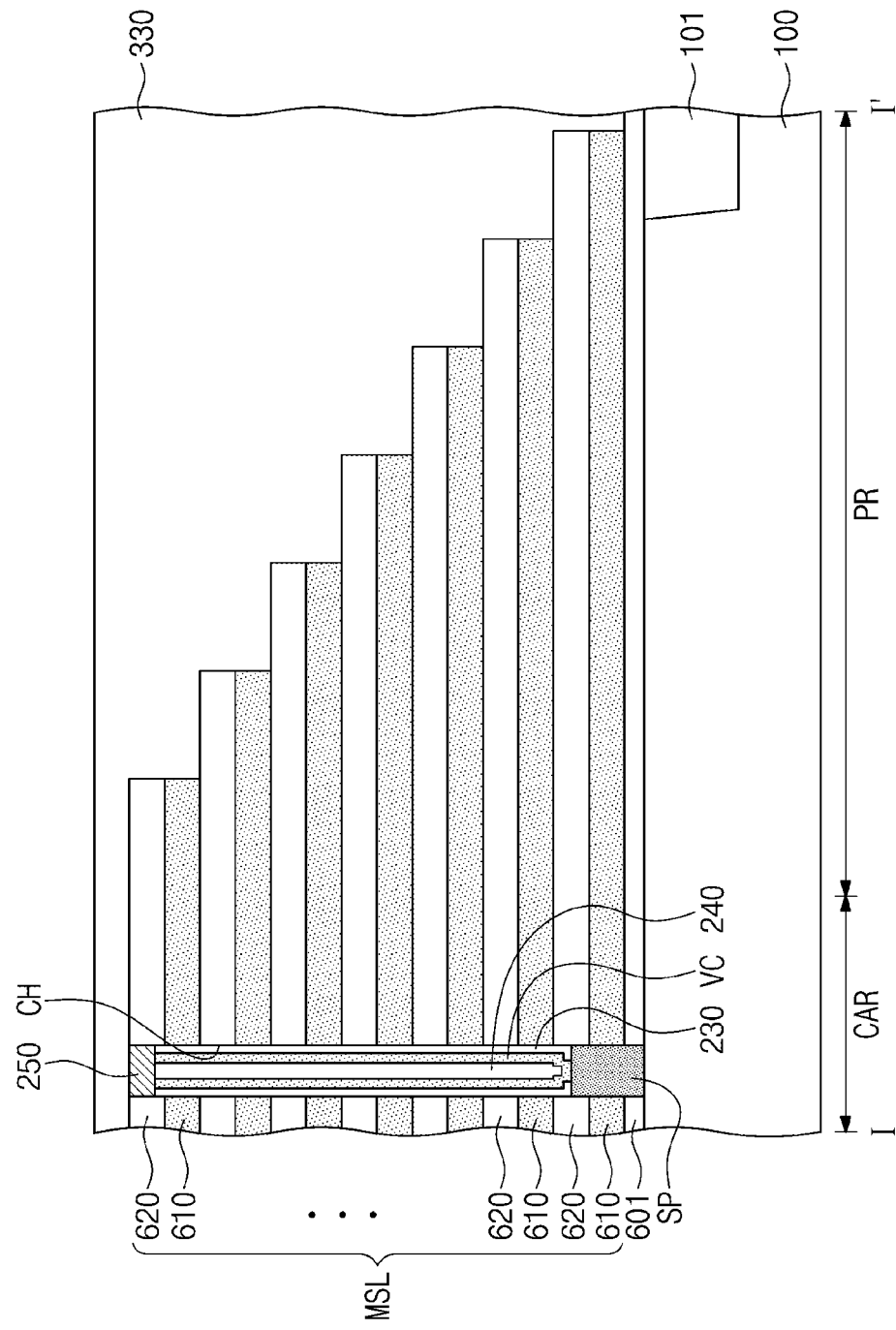
Figure 14B:
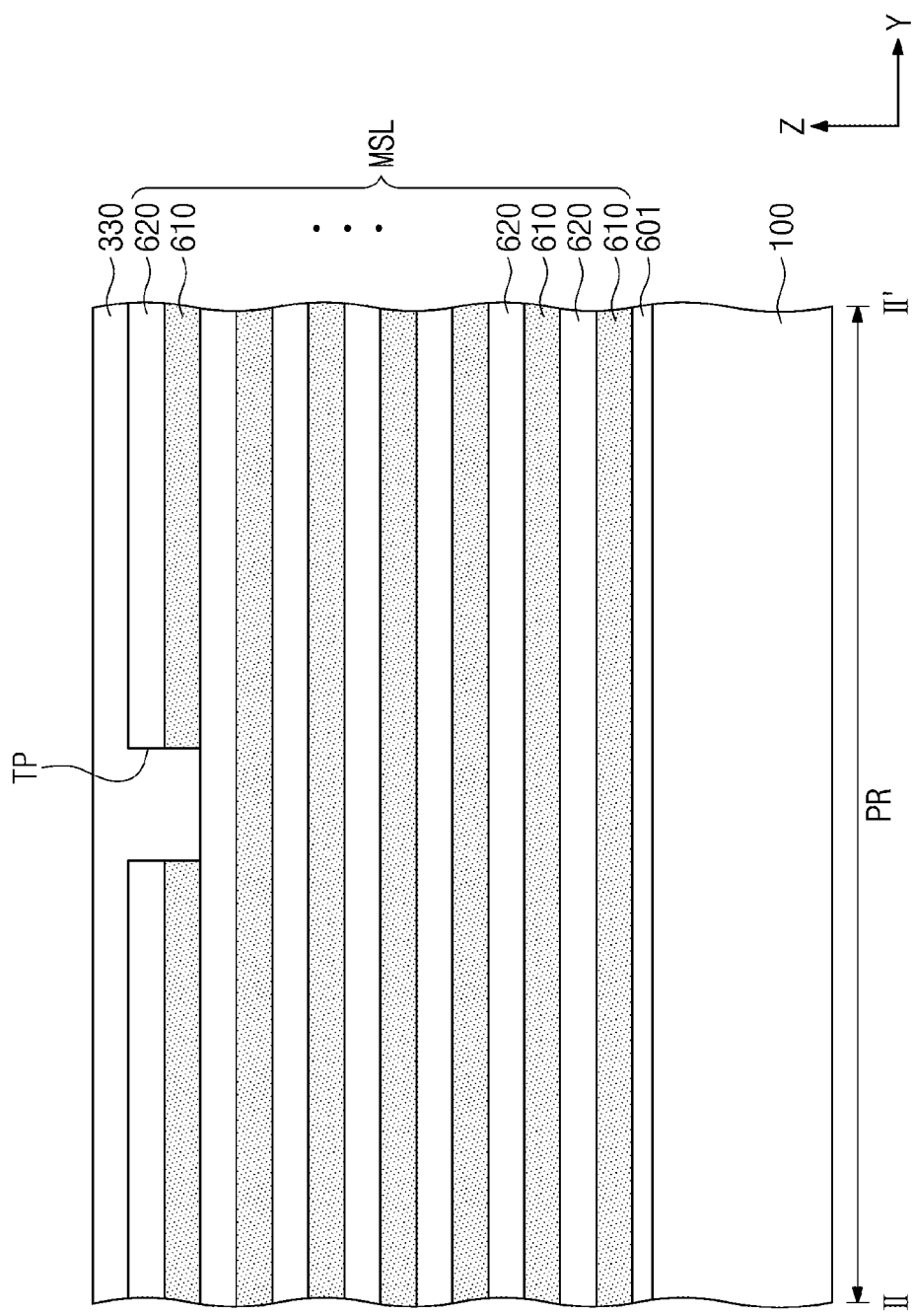
Figure 14C:
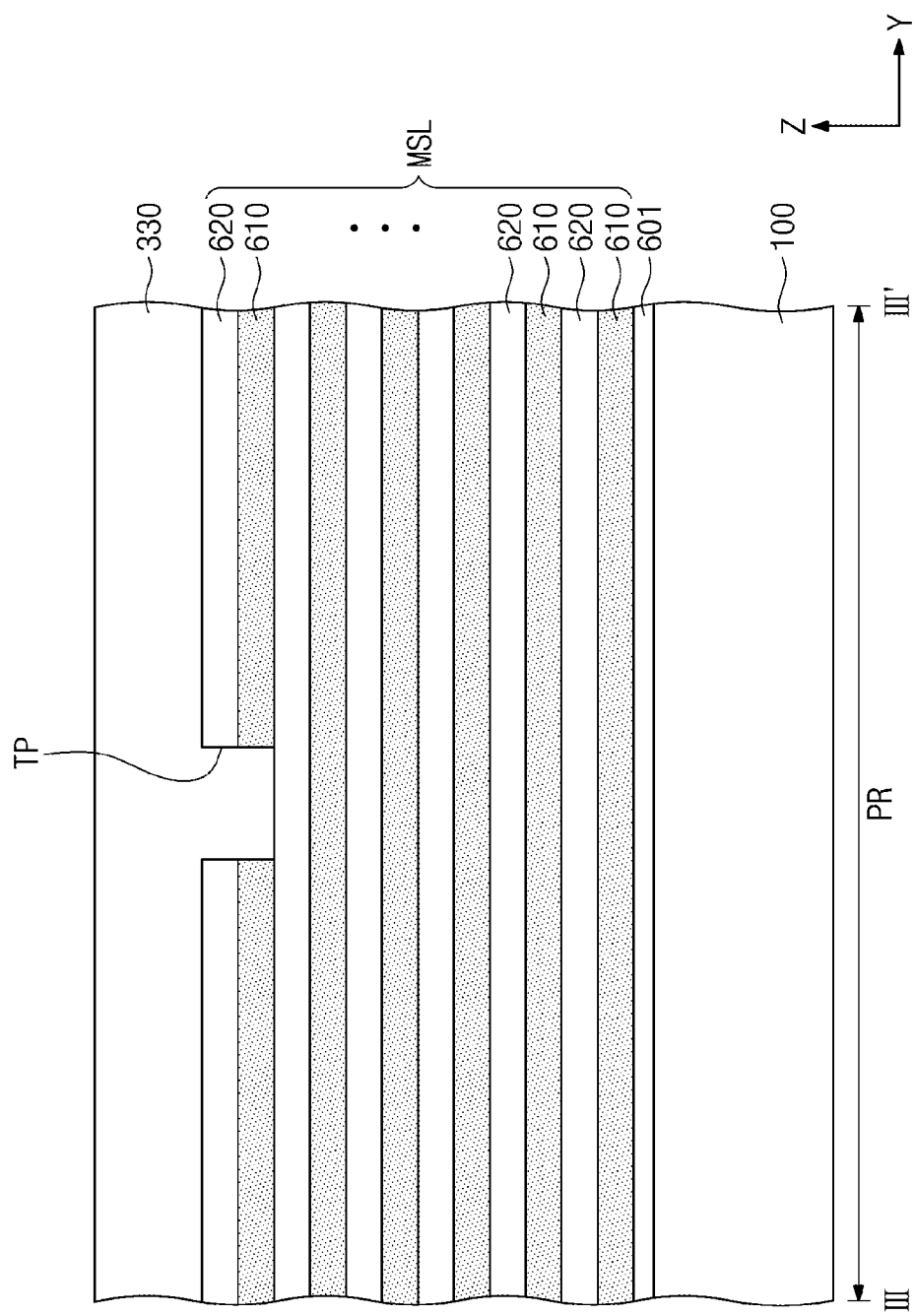

Referring to FIGS. 14A, 14B, and 14C, the protective interlayered insulating layer 330 may be formed on the stack layer MSL. The protective interlayered insulating layer 330 may cover or be on the top surface of the stack layer MSL and the stepwise structure of the stack layer MSL. The protective interlayered insulating layer 330 may fill the upper opening TP in whole or in part. The formation of the protective interlayered insulating layer 330 may include forming an insulating layer on the stack layer MSL and in the upper opening TP and performing a planarization process on the insulating layer. The protective interlayered insulating layer 330 may cover or be on the top surfaces of the pads 250. The protective interlayered insulating layer 330 may cover or be on side surfaces of the end portions of the conductive and insulating layers 610 and 620, which are exposed by the upper opening TP, and side surfaces of the uppermost conductive and insulating layers 610 and 620, which are disposed on the cell array region CAR of the substrate 100. A top surface of the protective interlayered insulating layer 330 may be positioned at a higher level than the top surface of the stack layer MSL relative to the substrate 100 in a Z direction in a cross-sectional view. The protective interlayered insulating layer 330 may be formed of or include, for example, silicon oxide.

Figure 15A:
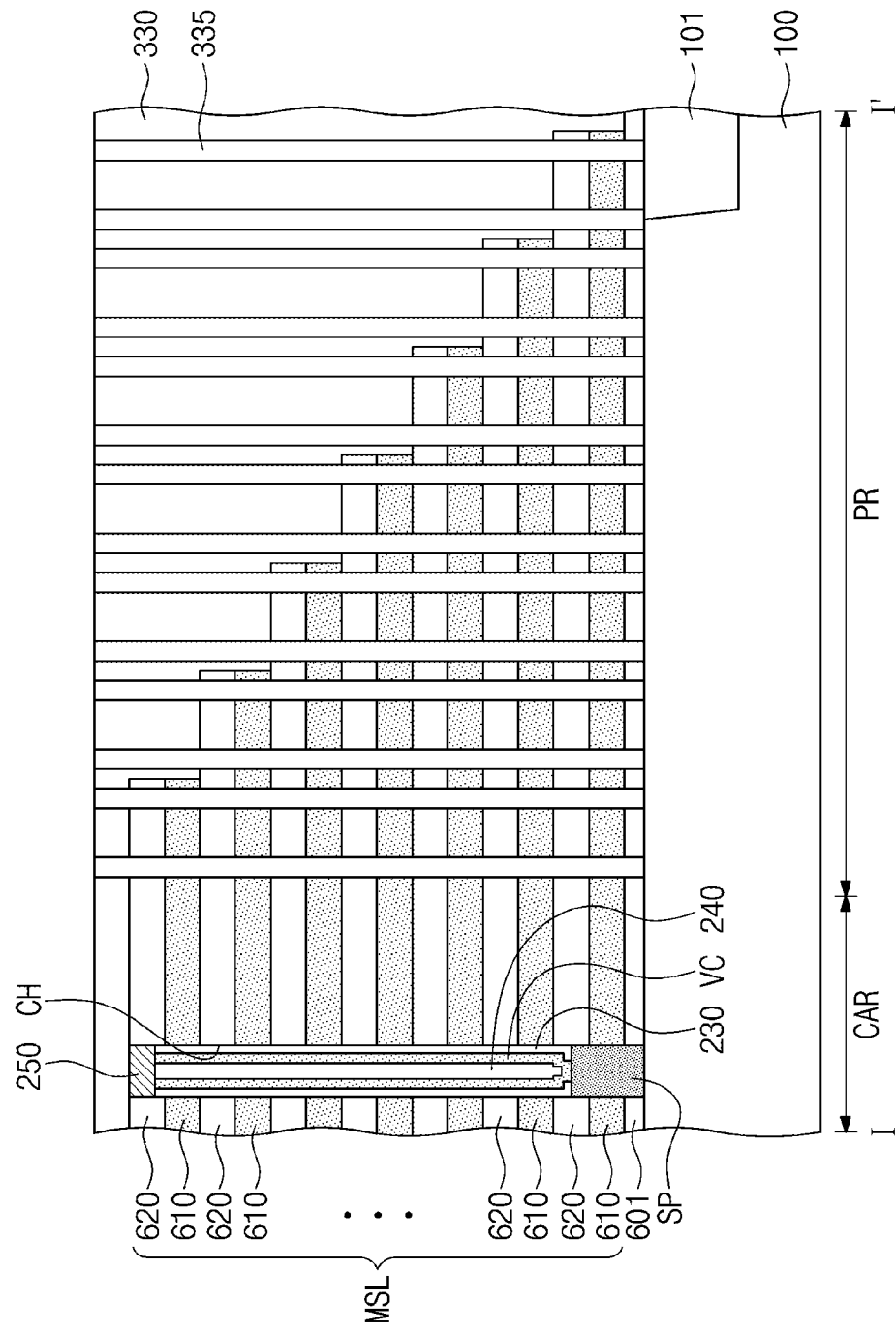
Figure 15B:
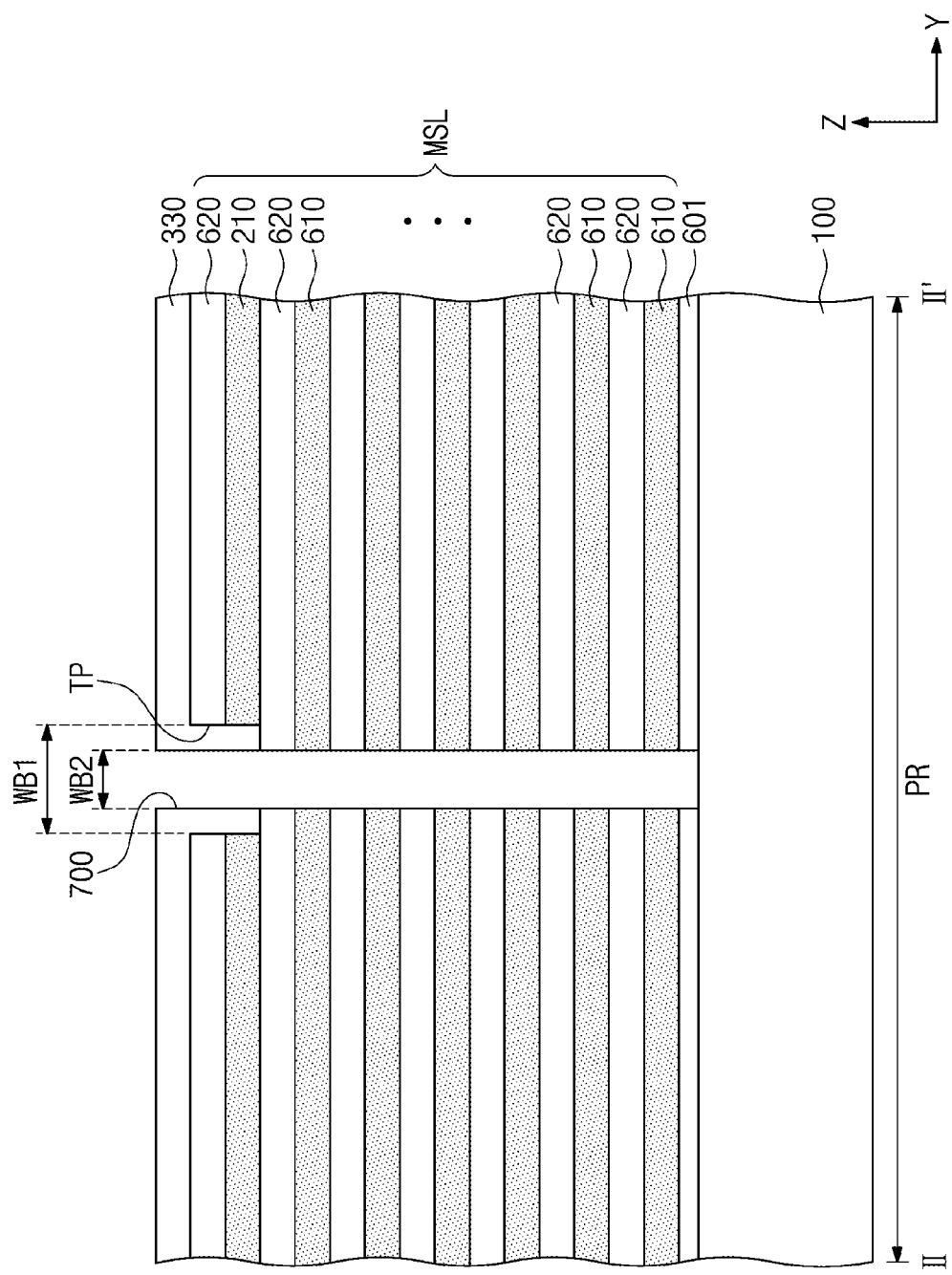
Figure 15C:
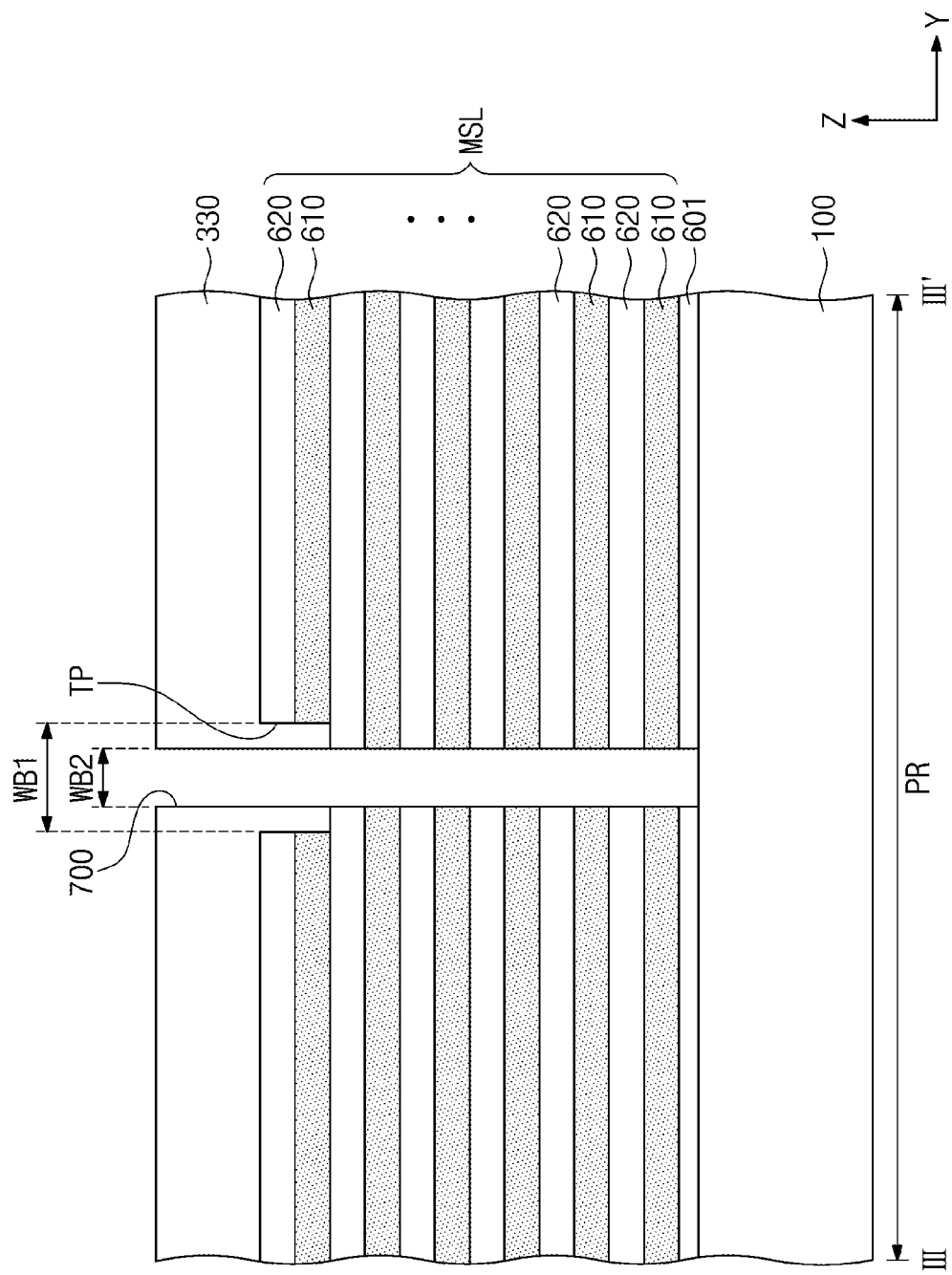

Referring to FIGS. 15A, 15B, and 15C, the supporting pillars 335 may be formed on the pad region PR of the substrate 100. The supporting pillars 335 may be formed to penetrate the stepwise structure of the stack layer MSL. For example, the supporting pillars 335 may be formed to penetrate the conductive layers 610, the insulating layers 620, and the buffer insulating layer 601 (e.g., see FIG. 14A) and to be in physical contact with the top surface of the substrate 100. The formation of the supporting pillars 335 may include forming penetration holes to penetrate the stepwise structure of the stack layer MSL and filling, in whole or in part, the penetration holes with an insulating material. The supporting pillars 335 may be formed of or include an insulating material (e.g., silicon oxide or silicon nitride).

The stack layer MSL provided on the pad region PR of the substrate 100 may be patterned to form a penetration trench 700. The penetration trench 700 may be formed to expose a portion of the top surface of the substrate 100. On the pad region PR of the substrate 100, side surfaces of the stacks ST disposed below the upper opening TP may be exposed by the penetration trench 700. For example, the side surfaces of the conductive layers 610 and the insulating layers 620 disposed below the upper opening TP may be exposed by the penetration trench 700. Side surfaces of the uppermost conductive layer 610 may be covered with or have disposed thereon the protective interlayered insulating layer 330. A width WB2 of the penetration trench 700 may be less than a width WB1 of the upper opening TP. The etching process may be performed by using, for example, a dry etching process.

Figure 16A:
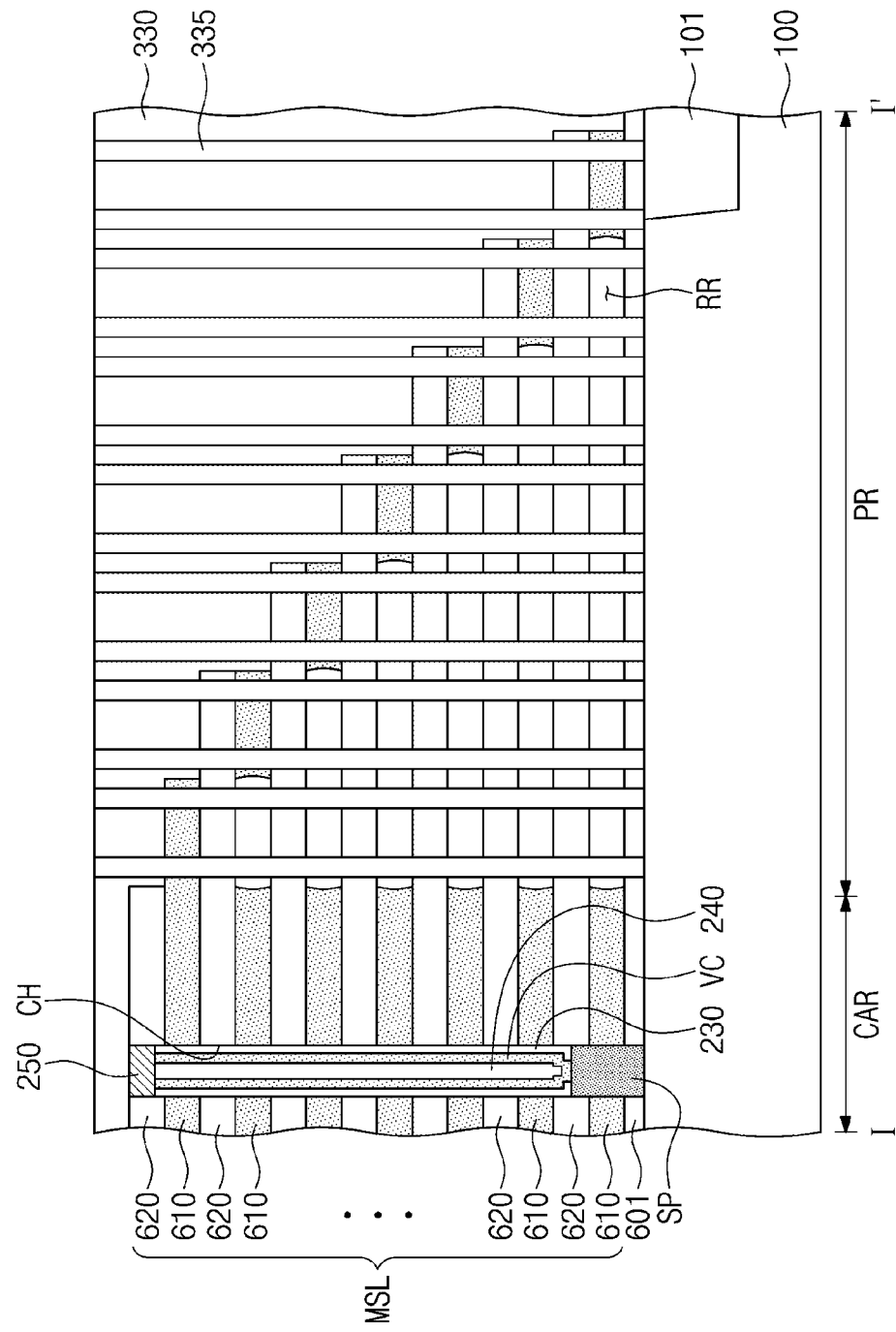
Figure 16B:
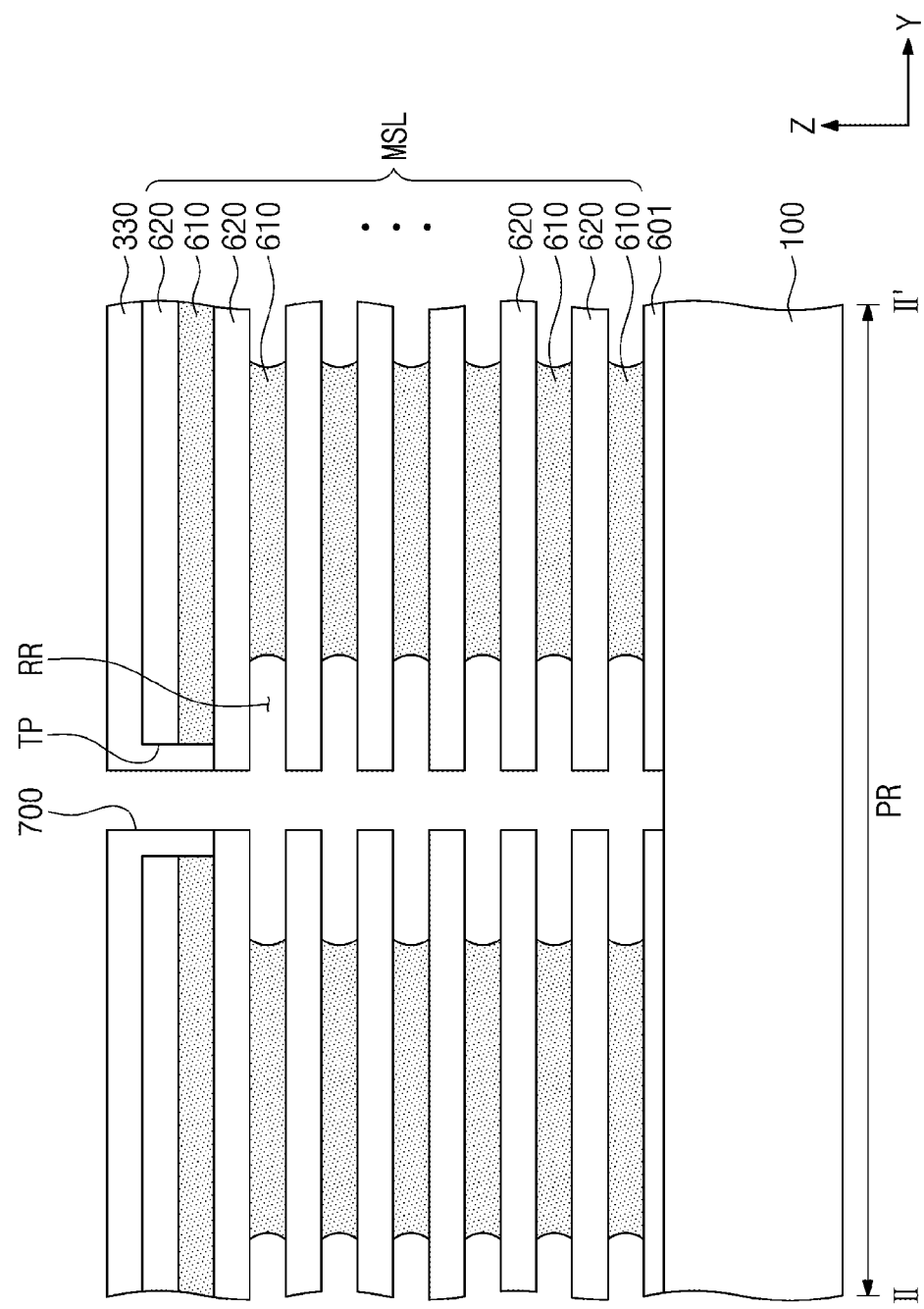
Figure 16C:
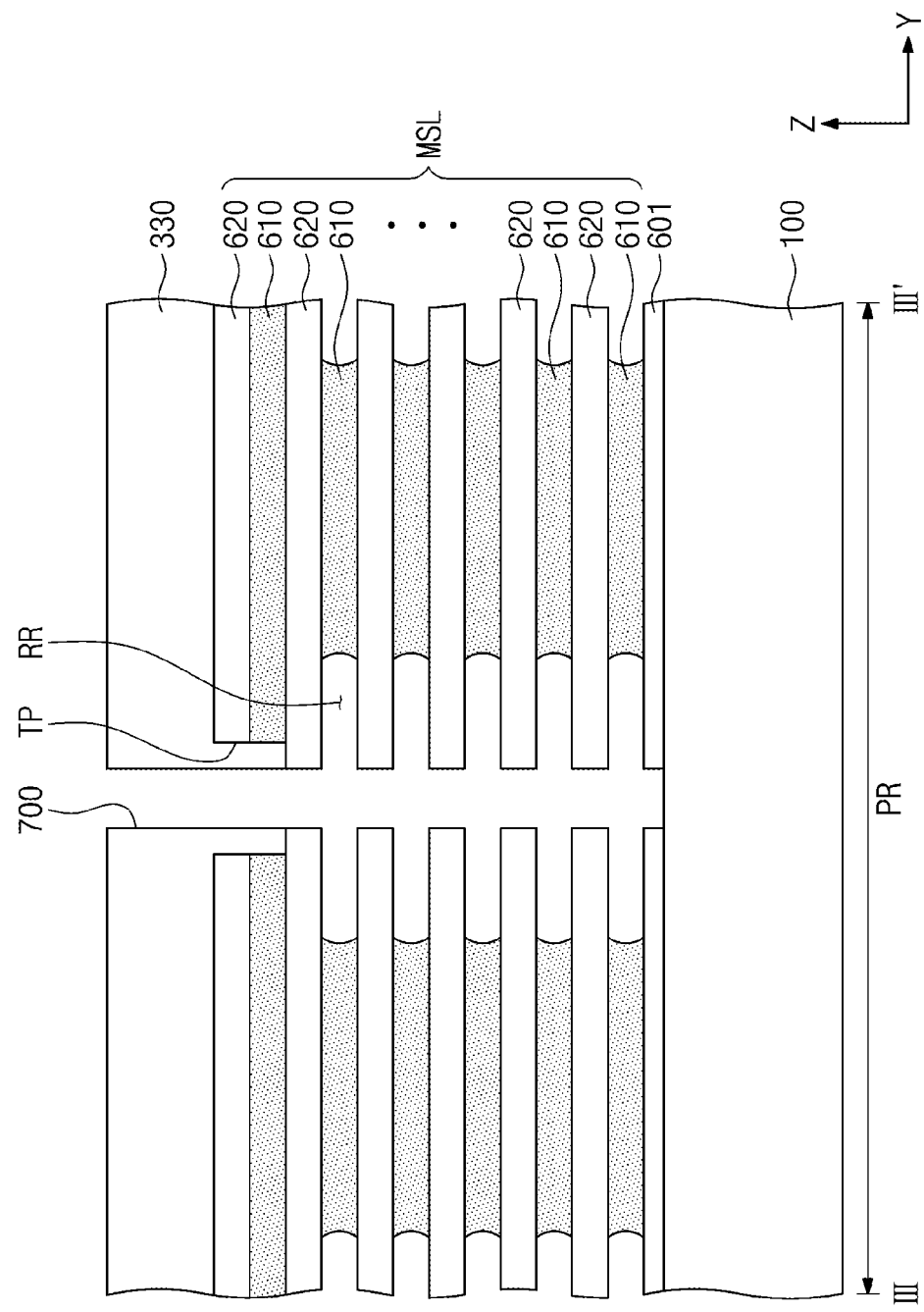

Referring to FIGS. 16A, 16B, and 16C, the conductive layers 610 and the insulating layers 620 exposed by the penetration trench 700 may be etched. The side surfaces of the conductive layers 610 exposed by the penetration trench 700 may be recessed from the side surfaces of the insulating layers 620 exposed by the penetration trench 700. As a result, recess regions RR may be formed between the buffer insulating layer 601 and the lowermost insulating layer 620 (i.e., the insulating layer 620 closest to the substrate 100), which are adjacent to each other in the vertical direction (e.g., the Z direction), and between the insulating layers 620, which are adjacent to each other in the vertical direction (e.g., the Z direction). The recess regions RR may be formed to expose a portion of the top surface of the buffer insulating layer 601, portions of the top surfaces of the insulating layers 620, except for the uppermost insulating layer 620 (i.e., the insulating layer 620 farthest from the substrate 100), and portions of the bottom surfaces of the insulating layers 620. The recess region RR may not be formed in the uppermost conductive layer 610 (i.e., the conductive layer 610 farthest from the substrate 100) between the uppermost insulating layer 620 and the second uppermost insulating layer 620.

The side surfaces of the end portions of the conductive layers 610 provided on the pad region PR of the substrate 100 may be covered with or have disposed thereon the protective interlayered insulating layer 330 and thus may not be etched by the etching process. In addition, after the etching process, other portions of the conductive layers 610 on the pad region PR, except for their end portions, may have a reduced width in the second direction Y. The etching process may be performed using the wet etching process. For example, the etching process may be performed using an etching solution having an etch selectivity with respect to the insulating layers 620, the buffer insulating layer 601, and the protective interlayered insulating layer 330. The side surfaces of the conductive layers 610 etched by the etching process may have a concavely curved section. The sidewalls of the supporting pillars 335 may be partially exposed through the recess regions RR. The supporting pillars 335 may not be etched during the etching of the gate electrodes 210a and 210b.

Figure 17A:
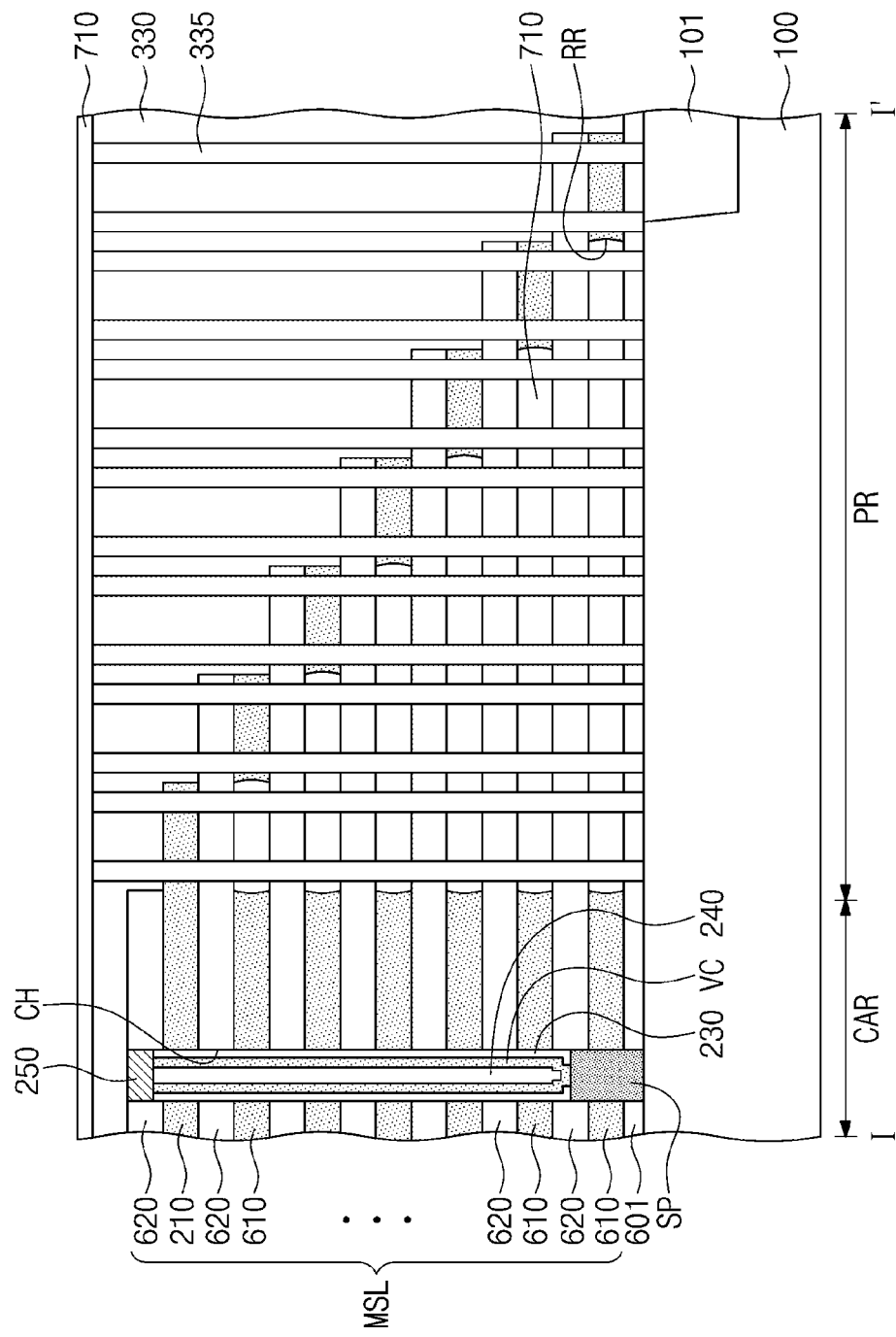
Figure 17B:
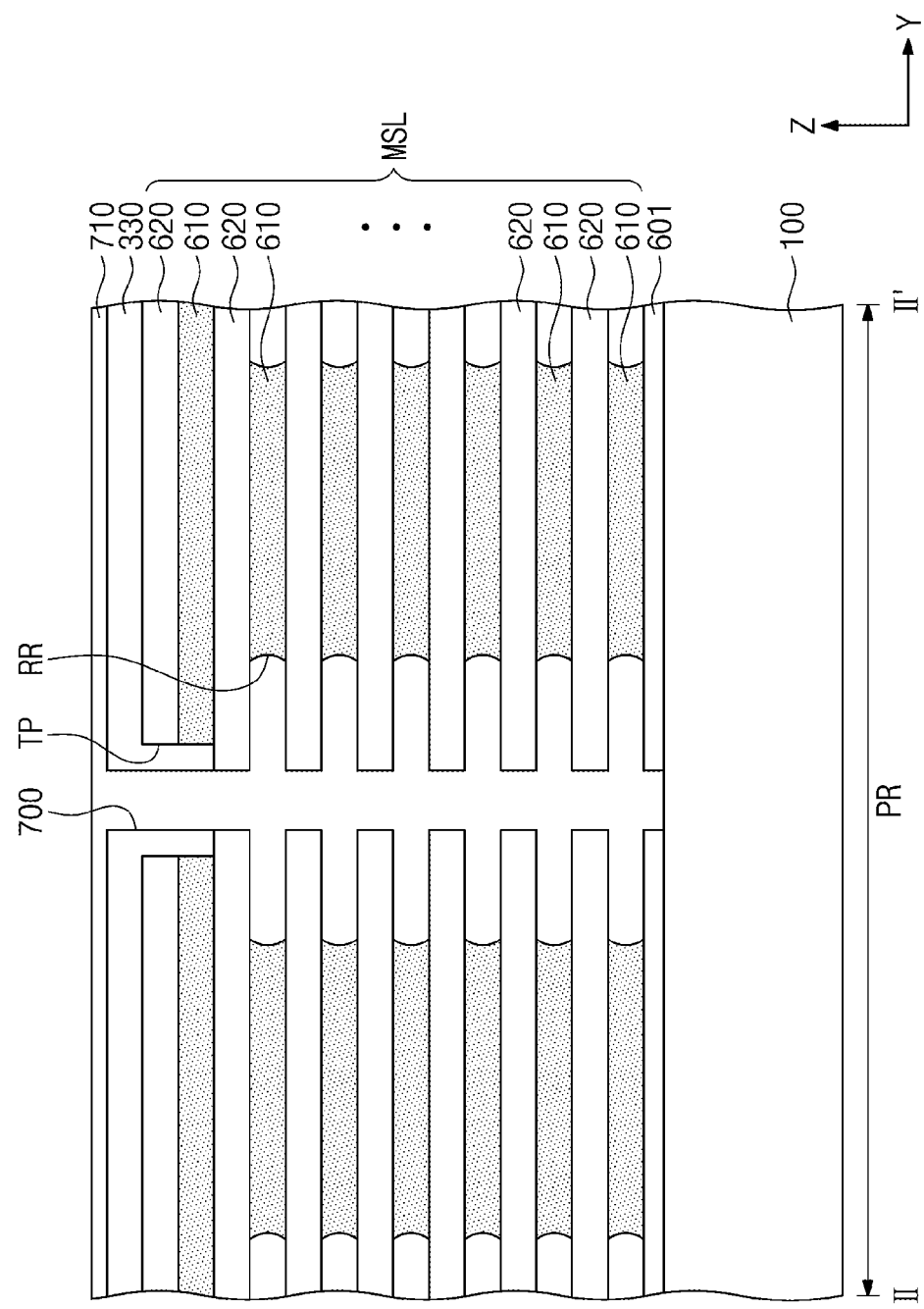
Figure 17C:
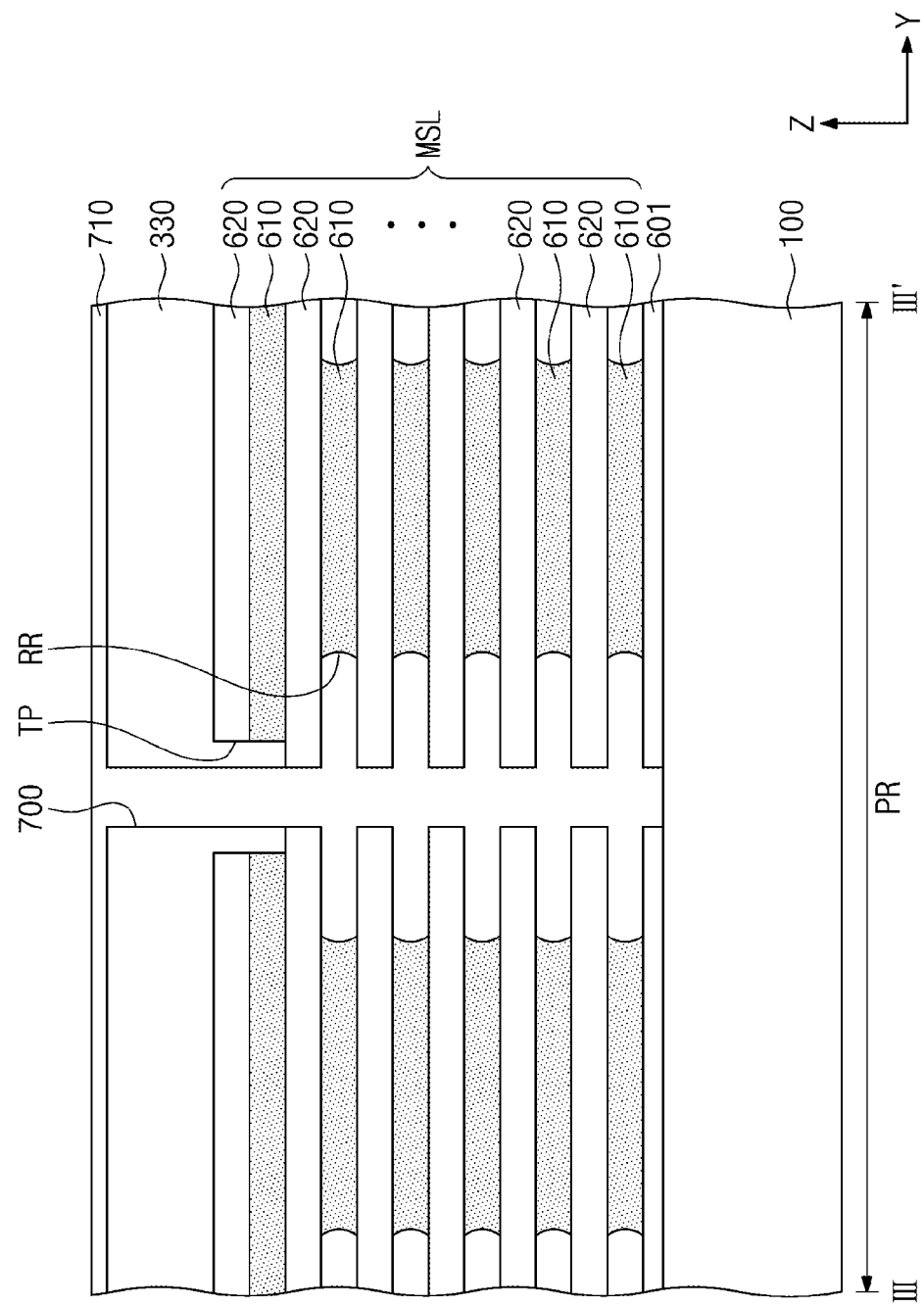

Referring to FIGS. 17A, 17B, and 17C, an edge insulating layer 710 may be formed in the penetration trench 700. The edge insulating layer 710 may fill, in whole or in part, the penetration trench 700 and the recess regions RR. The edge insulating layer 710 may cover or be on the top surface of the protective interlayered insulating layer 330 and top surfaces of the supporting pillars 335. The edge insulating layer 710 may be formed of or include, for example, silicon oxide.

Figure 18A:
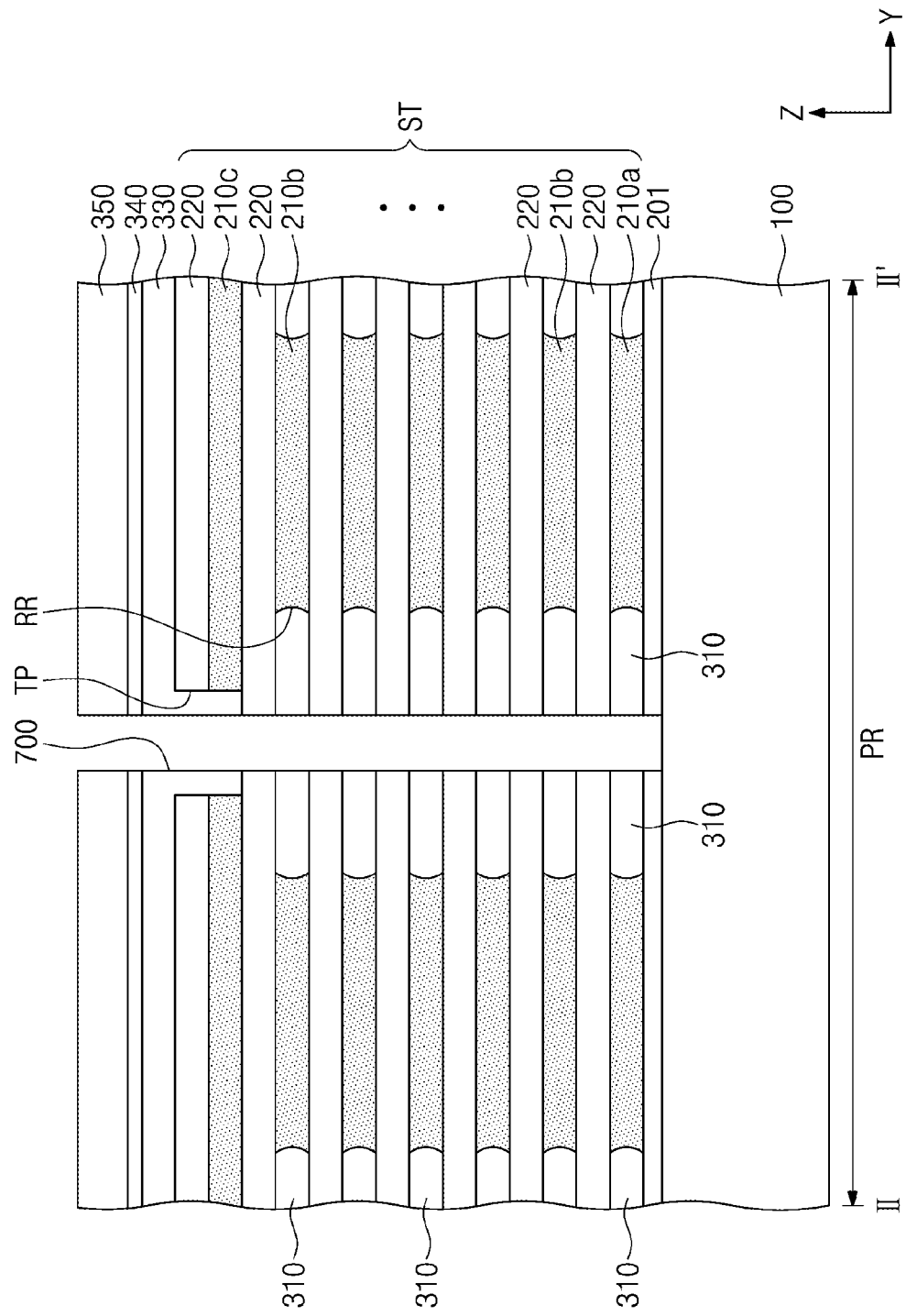
Figure 18B:
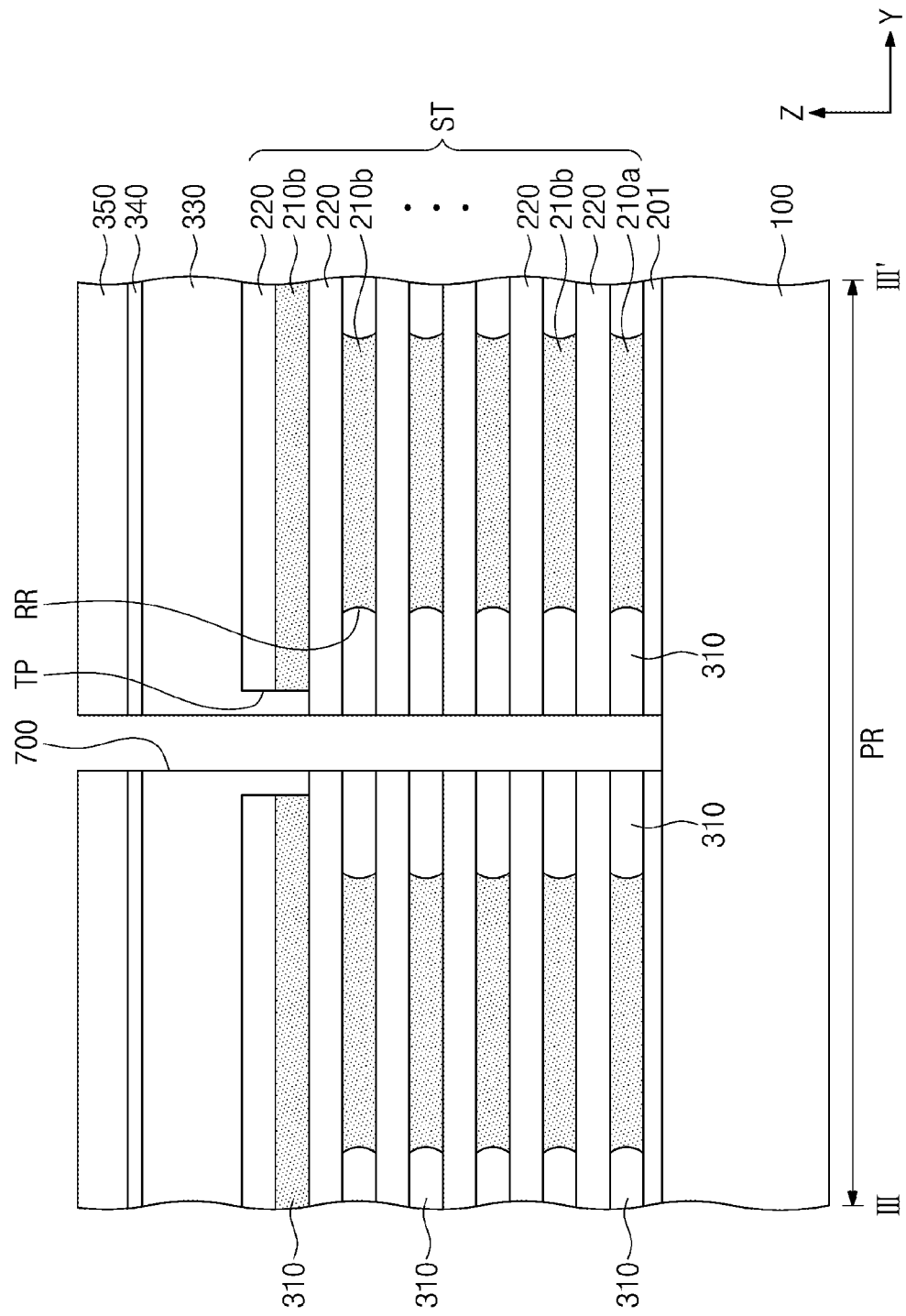

Referring to FIGS. 18A and 18B, the second interlayered insulating layer 350 may be formed on the edge insulating layer 710. The second interlayered insulating layer 350 may cover or be on a top surface of the edge insulating layer 710. The second interlayered insulating layer 350 may be formed of or include at least one of, for example, insulating materials (e.g., silicon oxide, silicon nitride, or silicon oxynitride).

The edge insulating layer 710 may be removed from the penetration trench 700, using the second interlayered insulating layer 350 as an etch mask. As a result, the edge insulating patterns 310 may be formed in the recess regions RR. The stack layer MSL formed on the cell array region CAR of the substrate 100 may be patterned by using the second interlayered insulating layer 350 as an etch mask such that the penetration trench 700 extends onto the cell array region CAR of the substrate 100. Accordingly, the stacks ST and the buffer insulating patterns 201 may be formed on the substrate 100. Each of the stacks ST may include the gate electrodes 210a, 210b, and 210c and the insulating patterns 220, which are alternately and repeatedly stacked on the substrate 100. The buffer insulating patterns 201 may be formed between the stacks ST and the substrate 100.

On the pad region PR of the substrate 100, the side surfaces of the edge insulating patterns 310 exposed by the penetration trench 700 may be aligned to the side surfaces of the insulating patterns 220 exposed by the penetration trench 700. By contrast, in some embodiments, on the pad region PR of the substrate 100, the side surfaces of the edge insulating patterns 310 exposed by the penetration trench 700 may be recessed from the side surfaces of the insulating patterns 220 exposed by the penetration trench 700. The edge insulating layer 710 formed in the penetration trench 700 may be removed to expose a portion of the top surface of the substrate 100. Because the edge insulating layer 710 formed in the penetration trench 700 is removed, the first interlayered insulating layer 340 may be formed on the top surface of the protective interlayered insulating layer 330. The first interlayered insulating layer 340 may be a portion of the edge insulating layer 710, which remains on the top surface of the protective interlayered insulating layer 330 after the etching process.

Figure 19A:
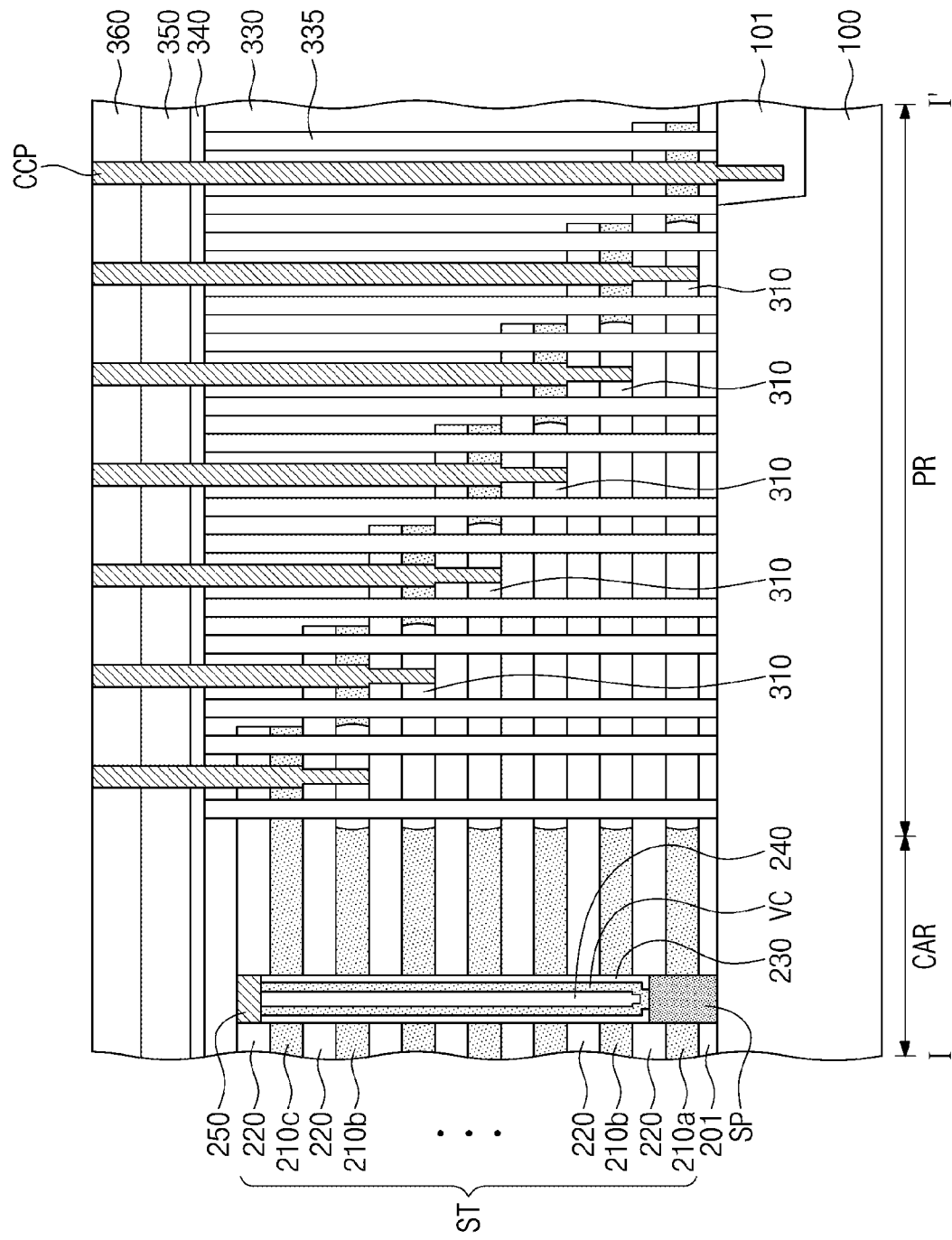
Figure 19B:
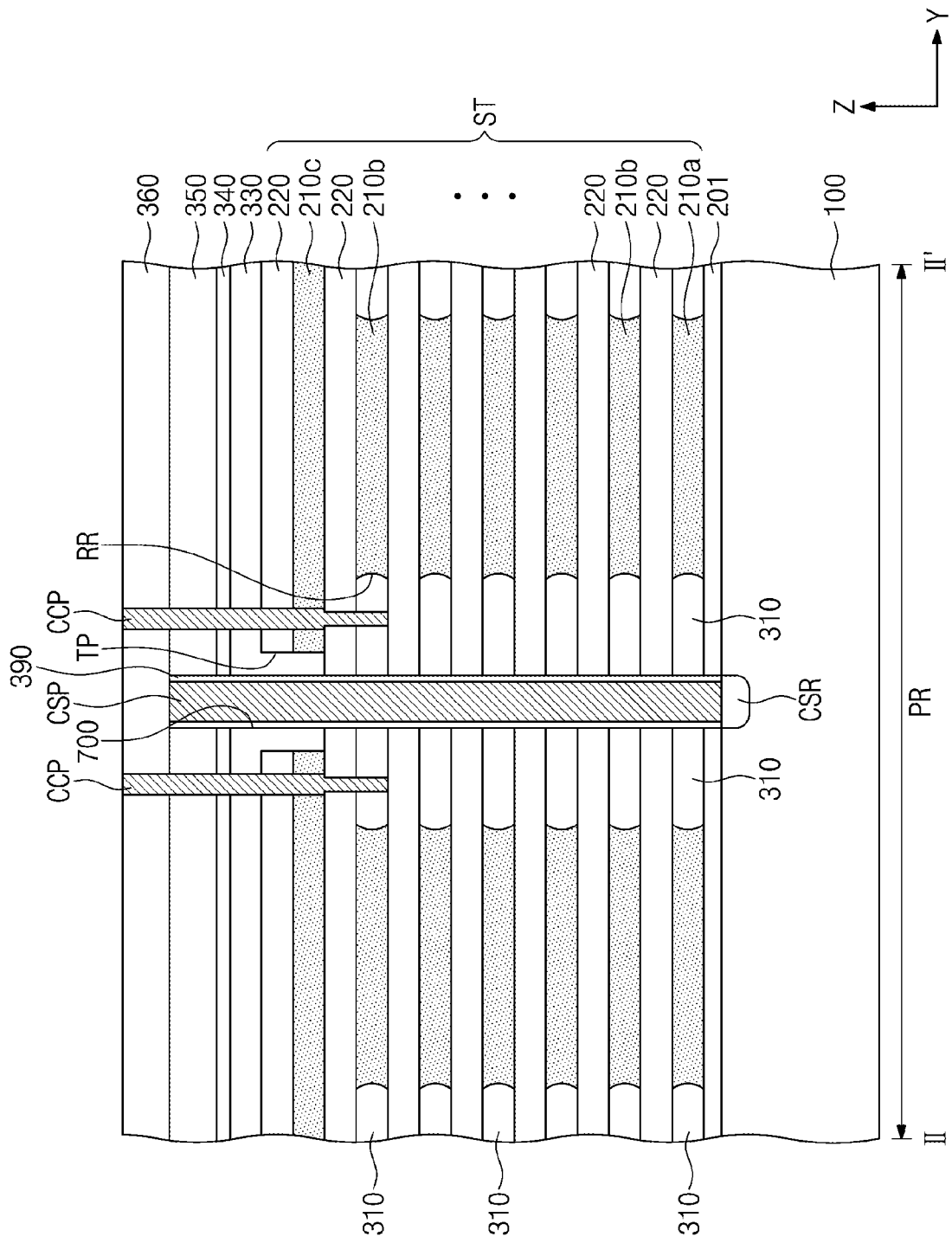
Figure 19C:
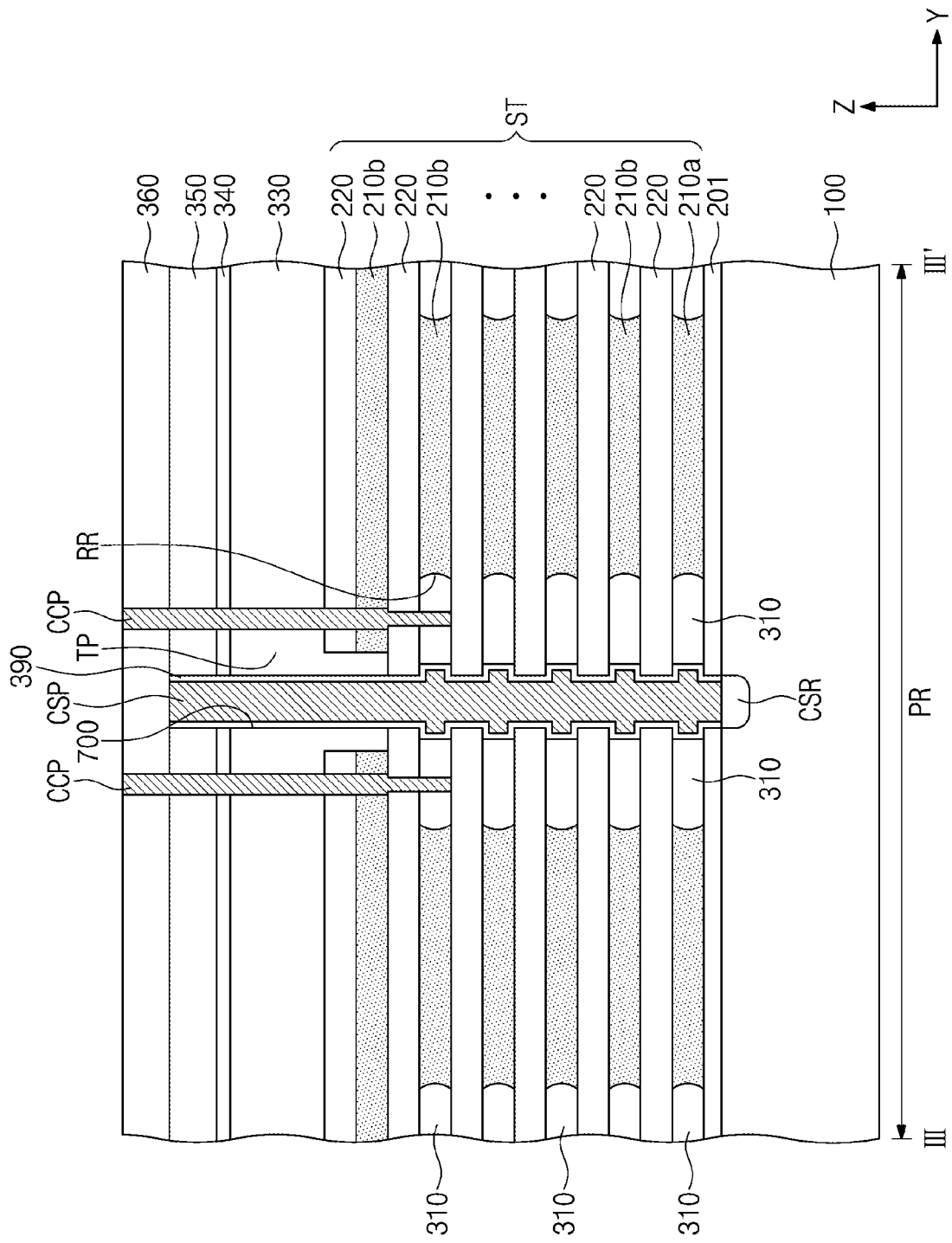

Referring to FIGS. 19A, 19B, and 19C, the common source region CSR may be formed in the substrate 100. The common source region CSR may be formed by performing an ion implantation process on the substrate 100 exposed by the penetration trench 700. The common source contact plug CSP may be formed in the penetration trench 700. The common source contact plug CSP may be formed by forming a conductive layer on the top surface of the second interlayered insulating layer 350 and in the penetration trench 700 and then by performing a planarization process on the conductive layer. A spacer 390 may be formed between the common source contact plug CSP and each of the stacks ST. On the cell array region CAR of the substrate 100, the spacer 390 may be in physical contact with the gate electrodes 210a, 210b, and 210c, and on the pad region PR of the substrate 100, the spacer 390 may be in physical contact with the edge insulating patterns 310. The spacer 390 may be formed of or include at least one of insulating materials (e.g., silicon oxide). The third interlayered insulating layer 360 may be formed on the second interlayered insulating layer 350. The third interlayered insulating layer 360 may cover or be on the top surface of the second interlayered insulating layer 350 and the top surface of the common source contact plug CSP. The third interlayered insulating layer 360 may be formed of or include at least one of insulating materials (e.g., silicon oxide, silicon nitride, or silicon oxynitride).

The cell contact plugs CCP may be formed on the pad region PR of the substrate 100. The cell contact plugs CCP may be provided to penetrate the third interlayered insulating layer 360, the second interlayered insulating layer 350, the first interlayered insulating layer 340, and the protective interlayered insulating layer 330. The cell contact plugs CCP may be formed to penetrate the end portions of the gate electrodes 210a, 210b, and 210c. Each of the cell contact plugs CCP may penetrate at least one of the edge insulating patterns 310 and at least one of the insulating patterns 220, which are disposed below (i.e., below in a Z direction in a cross-sectional view) a corresponding one of the gate electrodes 210a, 210b, and 210c electrically connected thereto. In an embodiment, the cell contact plug CCP penetrating the lowermost gate electrode 210a may be formed to penetrate the buffer insulating pattern 201 and may be partially inserted into the insulating gapfill layer 101.

Referring back to FIGS. 2, 3, and 4, the fourth interlayered insulating layer 370 may be formed on the third interlayered insulating layer 360. The top surface of the second interlayered insulating layer 350 may be covered with or have disposed thereon the third interlayered insulating layer 360. The sub-contact plugs STD may be formed in the fourth interlayered insulating layer 370. The sub-contact plugs STD may pass through the fourth interlayered insulating layer 370 and may be in contact with the cell contact plugs CCP. The sub-contact plugs STD may be formed of or include at least one of metals (e.g., copper or tungsten) or metal nitrides. The channel contact plugs HCP may be formed in the first to fourth interlayered insulating layers 340, 350, 360, and 370 and the protective interlayered insulating layer 330. The channel contact plugs HCP may be electrically connected to the pads 250. The interconnection lines 400 may be formed on the pad region PR of the substrate 100, and the bit lines BL may be formed on the cell array region CAR of the substrate 100. The interconnection lines 400 may be electrically connected to the sub-contact plugs STD. The bit lines BL may be electrically connected to the pads 250 through the channel contact plugs HCP.

According to some embodiments of the inventive concept, a conductive material (e.g., the same material as gate electrodes) may not be provided below (i.e., below in a Z direction in a cross-sectional view) end portions of the gate electrodes on a pad region of a substrate. Because end portions of string selection and cell gate electrodes do not vertically overlap (i.e., overlap in a Z direction in a cross-sectional view) the gate electrodes thereunder, it may be possible to prevent or reduce the likelihood of a cell contact plug from being connected to other gate electrodes, even when the cell contact plug is formed to penetrate the end portion of a desired one of the string selection and cell gate electrodes. This may make it possible to improve reliability of a three-dimensional semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a substrate including a cell array region and a pad region;
   a stack extending from the cell array region to the pad region and comprising a first gate electrode on the substrate, a second gate electrode between the first gate electrode and the substrate, an insulating pattern between the first gate electrode and the second gate electrode, and a first edge pattern between the insulating pattern and the substrate; and a first cell contact plug on the pad region that penetrates the first gate electrode, the insulating pattern, and the first edge pattern, the first cell contact plug comprising a step at a transition between a first width and a second width,
wherein the first cell contact plug has the first width at one portion horizontally adjacent to the first gate electrode and has the second width at another portion horizontally adjacent to the insulating pattern and the first edge pattern, and
wherein the first width is greater than the second width.

2. The device of claim 1, wherein the second gate electrode comprises a first portion on the cell array region and a second portion on the pad region and exposed by the first gate electrode in a plan view.

3. The device of claim 2, wherein the first edge pattern is between the first portion of the second gate electrode and the second portion of the second gate electrode.

4. The device of claim 3, wherein the first edge pattern vertically overlaps the first gate electrode,
wherein a top surface of the first edge pattern is in contact with the insulating pattern.

5. The device of claim 3, wherein a sidewall of the first edge pattern being in contact with the second gate electrode has a convex profile.

6. The device of claim 3, wherein the first cell contact plug penetrates the first edge pattern, and
wherein the first cell contact plug is spaced apart from each of the first and second portions of the second gate electrode.

7. The device of claim 3, further comprising a third gate electrode between the substrate and the second gate electrode, the third gate electrode comprising a third portion on the cell array region and a fourth portion on the pad region and exposed by the second gate electrode in a plan view; and
a second edge pattern between the third portion of the third gate electrode and the fourth portion of the third gate electrode,
wherein a length of the second edge pattern is greater than a length of the first edge pattern,
wherein at least a portion of the second edge pattern vertically overlaps the second portion of the second gate electrode, and is exposed by the first edge pattern in a plan view.

8. The device of claim 7, wherein the first cell contact plug penetrates the second edge pattern, and
wherein the first cell contact plug is spaced apart from each of the third and fourth portions of the third gate electrode.

9. The device of claim 7, further comprising a second cell contact plug on the pad region that penetrates the second portion of the second gate electrode and the second edge pattern, and
wherein the second cell contact plug is spaced apart from each of the third and fourth portions of the third gate electrode.

10. The device of claim 9, wherein the second cell contact plug has a third width at one portion horizontally adjacent to the second portion of the second gate electrode and has a fourth width at another portion which is at a level lower than a bottom surface of the second gate electrode, and
wherein the third width is greater than the fourth width.

11. The device of claim 1, further comprising a supporting pillar which penetrates the first gate electrode and the insulating pattern,
wherein the supporting pillar is in contact with the substrate, and
wherein the supporting pillar is formed of a single layer.

12. The device of claim 1, wherein the first cell contact plug comprises portions having different slopes of sidewalls.

13. A three-dimensional semiconductor memory device, comprising:
a first substrate including a cell array region and a pad region;
a second substrate on the first substrate;
an insulating gapfill layer in the pad region of the second substrate;
a peripheral circuit structure between the first substrate and the second substrate and comprising a peripheral circuit transistor;
a stack extending from the cell array region to the pad region and comprising gate electrodes and insulating patterns which are stacked alternately and repeatedly on the second substrate; and
cell contact plugs on the pad region, each of which penetrates one of the gate electrodes, the insulating patterns and the insulating gapfill layer, and is electrically connected to the peripheral circuit transistor,
wherein each of the cell contact plugs has a first width at one portion being in contact with the one of the gate electrodes and has a second width at another portion being in contact with the insulating patterns, and
wherein the first width is greater than the second width.

14. The device of claim 13, wherein gate electrodes including a topmost gate electrode and lower gate electrodes under the topmost gate electrode,
wherein each of the lower gate electrodes comprises a first portion on the cell array region, a second portion on the pad region and a third portion between the first portion and the second portion, and
wherein a sidewall of the third portion has a concave profile.

15. The device of claim 14, further comprising edge insulating patterns each of which is between the first portion and the second portion and on the sidewall of the third portion.

16. The device of claim 15, wherein lengths of the edge insulating patterns decrease with increasing distance from a top surface of the second substrate.

17. The device of claim 15, wherein the cell contact plugs include an outermost cell contact plug and inner cell contact plugs closer to the cell array region than the outermost cell contact plug, and
wherein each of the inner cell contact plugs penetrates at least one of the edge insulating patterns.

18. The device of claim 13, wherein each of the cell contact plugs comprises portions having different slopes of sidewalls.

19. A three-dimensional semiconductor memory device, comprising:
a first substrate including a cell array region and a pad region;
a second substrate on the first substrate;
an insulating gapfill layer in the pad region of the second substrate;
a peripheral circuit structure between the first substrate and the second substrate and comprising a peripheral circuit transistor;
a stack extending from the cell array region to the pad region and comprising a first gate electrode on the second substrate, a second gate electrode between the first gate electrode and the second substrate, and an insulating pattern between the first gate electrode and the second gate electrode;

a protective interlayered insulating layer on a top surface of the stack;

a vertical channel portion on the cell array region that penetrates at least a portion of the stack;

a cell contact plug on the pad region that penetrates the protective interlayered insulating layer, the first gate electrode, the insulating pattern and the insulating gapfill layer, and is electrically connected to the peripheral circuit transistor;

a bit line on the stack of the cell array region that is electrically connected to the vertical channel portion; and an interconnection line on the stack of the pad region that is electrically connected to the cell contact plug, wherein the cell contact plug has a first width at one portion horizontally adjacent to the first gate electrode and has a second width at another portion horizontally adjacent to the insulating pattern, and wherein the first width is greater than the second width.

20. The device of claim 19, wherein the cell contact plug comprises portions having different slopes of sidewalls.

\* \* \* \* \*